United States Patent
Kuh et al.

(10) Patent No.: US 7,817,464 B2
(45) Date of Patent: Oct. 19, 2010

(54) PHASE CHANGE MEMORY CELL EMPLOYING A GEBITE LAYER AS A PHASE CHANGE MATERIAL LAYER, PHASE CHANGE MEMORY DEVICE INCLUDING THE SAME, ELECTRONIC SYSTEM INCLUDING THE SAME AND METHOD OF FABRICATING THE SAME

(75) Inventors: Bong-Jin Kuh, Gyeonggi-do (KR); Yong-Ho Ha, Gyeonggi-do (KR); Doo-Hwan Park, Seoul (KR); Jeong-Hee Park, Gyeonggi-do (KR); Han-Bong Ko, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 478 days.

(21) Appl. No.: 11/747,395

(22) Filed: May 11, 2007

(65) Prior Publication Data

US 2007/0267721 A1    Nov. 22, 2007

(30) Foreign Application Priority Data

May 19, 2006    (KR) ..................... 10-2006-0045298

(51) Int. Cl.
    *G11C 11/00* (2006.01)
(52) U.S. Cl. .......................... 365/163; 365/148; 257/2
(58) Field of Classification Search .................. 365/46, 365/94, 100, 113, 129, 148, 163; 257/2–5, 257/296, E31.047, E27.006; 438/29, 95, 438/96, 166, 259, 365, 482, 486, 597; 977/754
See application file for complete search history.

(56) References Cited

U.S. PATENT DOCUMENTS 4,499,557 A    2/1985    Holmberg et al.

(Continued)

FOREIGN PATENT DOCUMENTS

CN    1684170 A    10/2005

(Continued)

OTHER PUBLICATIONS

Decision to Grant Patent for Korean Patent Application No. 10-2006-0045298; Oct. 15, 2007.

(Continued)

*Primary Examiner*—Richard Elms
*Assistant Examiner*—Harry W Byrne
(74) *Attorney, Agent, or Firm*—Myers Bigel Sibley & Sajovec

(57) ABSTRACT

A phase change memory cell includes an interlayer insulating layer formed on a semiconductor substrate, and a first electrode and a second electrode disposed in the interlayer insulating layer. A phase change material layer is disposed between the first and second electrodes. The phase change material layer may be an undoped GeBiTe layer, a doped GeBiTe layer containing an impurity or a doped GeTe layer containing an impurity. The undoped GeBiTe layer has a composition ratio within a range surrounded by four points (A1($Ge_{21.43}$, $Bi_{16.67}$, $Te_{61.9}$), A2($Ge_{44.51}$, $Bi_{0.35}$, $Te_{55.14}$), A3($Ge_{59.33}$, $Bi_{0.5}$, $Te_{40.17}$) and A4($Ge_{38.71}$, $Bi_{16.13}$, $Te_{45.16}$)) represented by coordinates on a triangular composition diagram having vertices of germanium (Ge), bismuth (Bi) and tellurium (Te). The doped GeBiTe layer contains an impurity and has a composition ratio within a range surrounded by four points (D1($Ge_{10}$, $Bi_{20}$, $Te_{70}$), D2($Ge_{30}$, $Bi_0$, $Te_{70}$), D3($Ge_{70}$, $Bi_0$, $Te_{30}$) and D4($Ge_{50}$, $Bi_{20}$, $Te_{30}$)) represented by coordinates on the triangular composition diagram.

24 Claims, 10 Drawing Sheets

U.S. PATENT DOCUMENTS

| | | | |
|---|---|---|---|
| 4,599,705 A | 7/1986 | Holmberg et al. | |
| 4,653,024 A | 3/1987 | Young et al. | |
| 4,719,594 A | 1/1988 | Young et al. | |
| 4,820,394 A | 4/1989 | Young et al. | |
| 4,845,533 A | 7/1989 | Pryor et al. | |
| 4,924,436 A | 5/1990 | Strand | |
| 5,124,232 A | 6/1992 | Nakanishi et al. | |
| 5,166,758 A | 11/1992 | Ovshinsky et al. | |
| 5,194,363 A | 3/1993 | Yoshioka et al. | |
| 5,278,011 A | 1/1994 | Yamada et al. | |
| 5,341,328 A * | 8/1994 | Ovshinsky et al. | 365/163 |
| 5,536,947 A | 7/1996 | Klersy et al. | |
| 5,714,768 A | 2/1998 | Ovshinsky et al. | |
| 5,811,816 A | 9/1998 | Gallagher et al. | |
| 5,825,046 A | 10/1998 | Czubatyj et al. | |
| RE36,383 E | 11/1999 | Yoshioka et al. | |
| 6,087,674 A | 7/2000 | Ovshinsky et al. | |
| 6,141,241 A | 10/2000 | Ovshinsky et al. | |
| 6,177,166 B1 | 1/2001 | Ohno et al. | |
| 6,258,062 B1 | 7/2001 | Thielen et al. | |
| 6,365,256 B1 | 4/2002 | Tyan et al. | |
| 6,381,967 B1 | 5/2002 | Craig | |
| 6,429,064 B1 | 8/2002 | Wicker | |
| 6,437,383 B1 | 8/2002 | Xu | |
| 6,496,946 B2 | 12/2002 | Bannatyne et al. | |
| 6,507,061 B1 | 1/2003 | Klersy et al. | |
| 6,511,862 B2 | 1/2003 | Hudgens et al. | |
| 6,586,761 B2 | 7/2003 | Lowrey | |
| 6,588,540 B2 | 7/2003 | Graber et al. | |
| 6,593,176 B2 | 7/2003 | Dennison | |
| 6,648,096 B2 | 11/2003 | Berg et al. | |
| 6,650,979 B1 | 11/2003 | Kreft | |
| 6,670,628 B2 | 12/2003 | Lee et al. | |
| 6,690,026 B2 | 2/2004 | Peterson | |
| 6,750,469 B2 | 6/2004 | Ichihara et al. | |
| 6,759,267 B2 | 7/2004 | Chen | |
| 6,774,388 B2 | 8/2004 | Hudgens et al. | |
| 6,850,432 B2 | 2/2005 | Lu et al. | |
| 6,856,002 B2 | 2/2005 | Moore et al. | |
| 6,858,277 B1 | 2/2005 | Yamada et al. | |
| 6,859,389 B2 | 2/2005 | Idehara | |
| 6,864,503 B2 | 3/2005 | Lung | |
| 6,867,425 B2 | 3/2005 | Wicker | |
| 6,884,991 B2 | 4/2005 | Durocher | |
| 6,899,938 B2 | 5/2005 | Flynn | |
| 6,919,578 B2 | 7/2005 | Lowrey et al. | |
| 6,933,031 B2 | 8/2005 | Ohta et al. | |
| 7,037,762 B2 | 5/2006 | Joo et al. | |
| 7,049,623 B2 | 5/2006 | Lowrey | |
| 7,067,865 B2 | 6/2006 | Lung | |
| 7,088,670 B2 | 8/2006 | Kondo | |
| 7,115,927 B2 | 10/2006 | Hideki et al. | |
| 7,187,373 B2 | 3/2007 | Tobita | |
| 7,205,562 B2 | 4/2007 | Wicker | |
| 7,292,521 B2 | 11/2007 | Ovshinsky et al. | |
| 7,394,088 B2 | 7/2008 | Lung | |
| 2002/0038872 A1 | 4/2002 | Lowrey et al. | |
| 2002/0072010 A1 | 6/2002 | Kubogata | |
| 2002/0081804 A1 | 6/2002 | Gill et al. | |
| 2002/0160553 A1 | 10/2002 | Yamanaka et al. | |
| 2003/0047762 A1 | 3/2003 | Lowrey | |
| 2003/0067013 A1 | 4/2003 | Ichihara et al. | |
| 2003/0080427 A1 | 5/2003 | Hudgens et al. | |
| 2003/0122170 A1 | 7/2003 | Apodaca et al. | |
| 2003/0151041 A1 | 8/2003 | Chiang | |
| 2003/0156468 A1 | 8/2003 | Campbell et al. | |
| 2003/0165111 A1 | 9/2003 | Flynn | |
| 2003/0186504 A1 | 10/2003 | Li et al. | |
| 2004/0012009 A1 | 1/2004 | Casagrande et al. | |
| 2004/0106065 A1 | 6/2004 | Miyamoto et al. | |
| 2004/0114317 A1 | 6/2004 | Chiang et al. | |
| 2004/0115945 A1 | 6/2004 | Lowrey et al. | |
| 2004/0191683 A1 | 9/2004 | Nishihara et al. | |
| 2004/0192006 A1 | 9/2004 | Campbell et al. | |
| 2004/0248339 A1 | 12/2004 | Lung | |
| 2005/0002227 A1 | 1/2005 | Hideki et al. | |
| 2005/0029502 A1 | 2/2005 | Hudgens | |
| 2005/0030800 A1 | 2/2005 | Johnson et al. | |
| 2005/0064334 A1 | 3/2005 | Hirotsune et al. | |
| 2005/0115829 A1 | 6/2005 | Yahagi et al. | |
| 2005/0227035 A1 | 10/2005 | Fuchioka et al. | |
| 2006/0281217 A1 | 12/2006 | Hideki et al. | |
| 2007/0221906 A1 | 9/2007 | Hideki et al. | |
| 2008/0169457 A1 | 7/2008 | Hideki et al. | |

FOREIGN PATENT DOCUMENTS

| | | |
|---|---|---|
| JP | 01-220236 A | 9/1989 |
| JP | 10340489 A | 12/1998 |
| JP | 2002-203392 | 7/2002 |
| JP | 2004-291646 | 10/2004 |
| JP | 2004-310992 | 11/2004 |
| JP | 2004-349504 | 12/2004 |
| JP | 2005-141831 | 6/2005 |
| KR | 2000-0052840 A | 8/2000 |
| KR | 20010006496 A | 1/2001 |
| KR | 10-2001-7011708 | 12/2001 |
| KR | 1020020059162 A | 7/2002 |
| KR | 10-2004-0078464 A | 9/2004 |
| KR | 1020040084860 A | 10/2004 |
| KR | 2001-0111276 A | 2/2005 |
| WO | WO 98/19350 A1 | 5/1998 |
| WO | WO/98/47142 | 10/1998 |
| WO | WO 00/54982 A1 | 9/2000 |
| WO | WO 03/020998 A2 | 3/2003 |

OTHER PUBLICATIONS

English Translation of Decision to Grant Patent for Korean Patent Application No. 10-2006-0045298: Oct. 15, 2007.

Chinese Office Action (10 pages) and the English translation (12 pages) corresponding to Chinese Patent Application No. 200710103453.7; Mailing Date: Jan. 3, 2009.

Seo et al., "Investigation of Crystallization Behavior of Sputter-Deposited Nitrogen-Doped Amorphous $Ge_2Sb_2Te^5$ Thin Films," Jpn. J. Appl. Phys., vol. 39, Part 1, No. 2B, Feb. 2000, pp. 745-751.

Notice to File Response/Amendment to the Examination Report, Korean Application No. 10-2004-0012358, Dec. 21, 2005.

Notice to File a Response/Amendment to the Examination Report corresponding to Korean Patent Application No. 10-2004-0012358 mailed May 24, 2006.

* cited by examiner

PHASE CHANGE MEMORY CELL EMPLOYING A GEBITE LAYER AS A PHASE CHANGE MATERIAL LAYER, PHASE CHANGE MEMORY DEVICE INCLUDING THE SAME, ELECTRONIC SYSTEM INCLUDING THE SAME AND METHOD OF FABRICATING THE SAME

REFERENCE TO PRIORITY APPLICATION

This application claims priority to Korean Patent Application No. 2006-45298, filed May 19, 2006, the disclosure of which is hereby incorporated herein by reference.

FIELD OF THE INVENTION

The present invention relates to nonvolatile memory devices, and more particularly, to a phase change memory cell employing a GeBiTe layer as a phase change material layer, a phase change memory device including the same, an electronic system including the same, and a method of fabricating the same.

BACKGROUND OF THE INVENTION

Nonvolatile memory devices retain their stored data even when their power supplies are turned off. Thus, the nonvolatile memory devices are widely used in computers, mobile telecommunication systems, memory cards and so on.

Recently, other types of nonvolatile memory devices, for example, phase change memory devices are being used. A unit cell of a phase change memory device includes a switching device and a data storage element serially connected to the switching device. The data storage element has top and bottom electrodes and a phase change material layer interposed therebetween, and the bottom electrode is electrically connected to the switching device.

In general, the bottom electrode acts as a heater. When a write current flows through the switching device and the bottom electrode, Joule heat is generated at an interface between the phase change material layer and the bottom electrode. Such Joule heat converts the phase change material layer to an amorphous state (reset state) or a crystalline state (set state). The phase change material layer having the amorphous state exhibits a higher resistance than the phase change material layer having the crystalline state. Accordingly, the phase change material layer is widely employed as the data storage element of the phase change memory device.

The switching device should be designed to have a current drivability sufficient to supply the write current. However, an area occupied by the switching device should be increased in order to enhance the current drivability. When the area of the switching device is increased, it is difficult to improve the integration density of the phase change memory device.

An alloy layer of germanium (Ge), antimony (Sb) and tellurium (Te) (hereinafter, referred to as a "GeSbTe" layer) is widely used as a phase change material layer. A set pulse signal having a long time of several hundreds of nano seconds is required to crystallize the GeSbTe layer. Accordingly, there may be a limitation in improving the write speed (program speed) of the phase change memory device employing the GeSbTe layer. Also, a reset pulse signal having a high write current (reset current) of about 0.8 mA to about 1 mA is required to transform the GeSbTe layer into the amorphous state (reset state). Accordingly, when the GeSbTe layer is employed as the phase change material layer of the phase change memory device, there may be a limitation in reducing power consumption in a write (program) mode of the phase change memory device.

The GeSbTe layer may be doped with impurities such as silicon atoms or nitrogen atoms. In this case, the GeSbTe layer may have small and uniform grains due to the impurities. Accordingly, energy required to transform the GeSbTe layer into an amorphous state may be reduced to further decrease the reset current of the GeSbTe layer. However, the impurities within the GeSbTe layer disturb the GeSbTe layer from being crystallized. Consequently, when the GeSbTe layer is doped with the impurities, the reset current of the doped GeSbTe layer is decreased whereas the set pulse width of the GeSbTe layer is increased.

An optical information recording medium employing GeBiTe layer as a phase change material layer is disclosed in U.S. patent publication No. 2005/0227035 A1 to Fuchioka et al., entitled "Information Recording Medium".

Another information recording medium employing GeBiTe layer as a phase change material layer is disclosed in U.S. Pat. No. 6,858,277 B1 to Yamada et al., entitled "Information Recording Medium and Method for Manufacturing the Same".

SUMMARY OF THE INVENTION

An embodiment of the invention includes a phase change memory cell employing a GeBiTe layer or a doped GeTe layer as a phase change material layer. The phase change memory cell includes an interlayer insulating layer formed on a semiconductor substrate and first and second electrodes disposed on the interlayer insulating layer. A phase change material layer is disposed between the first and second electrodes. The phase change material layer comprises one of an undoped GeBiTe layer, a doped GeBiTe layer containing an impurity and a doped GeTe layer containing an impurity. The undoped GeBiTe layer has a composition ratio within a range surrounded by four points (A1($Ge_{21.43}$, $Bi_{16.67}$, $Te_{61.9}$), A2($Ge_{44.51}$, $Bi_{0.35}$, $Te_{55.14}$), A3($Ge_{59.33}$, $Bi_{0.5}$, $Te_{40.17}$) and A4($Ge_{38.71}$, $Bi_{16.13}$, $Te_{45.16}$)) represented by coordinates on a triangular composition diagram having vertices of germanium (Ge), bismuth (Bi) and tellurium (Te), and the doped GeBiTe layer contains an impurity and has a composition ratio within a range surrounded by four points (D1($Ge_{10}$, $Bi_{20}$, $Te_{70}$), D2($Ge_{30}$, $Bi_0$, $Te_{70}$), D3($Ge_{70}$, $Bi_0$, $Te_{30}$) and D4($Ge_{50}$, $Bi_{20}$, $Te_{30}$)) represented by coordinates on the triangular composition diagram. Also, the doped GeTe layer contains an impurity and has a composition ratio corresponding to coordinates on a straight line between the points D2 and D3. A bit line is disposed on the interlayer insulating layer. The bit line is electrically connected to the second electrode.

In some embodiments of the present invention, the phase change memory cell may further comprise a cell switching device formed on the semiconductor substrate. The cell switching device is electrically connected to the first electrode. The cell switching device may be a metal oxide semiconductor (MOS) transistor having source and drain regions formed in the semiconductor substrate as well as a word line disposed over a channel region between the source and drain regions. The first electrode is electrically connected to one of the source and drain regions.

Alternatively, the cell switching device may be a cell diode. The cell diode may be a vertical cell diode having an second conductivity-type semiconductor and a first conductivity-type semiconductor, which are sequentially stacked in the interlayer insulating layer, and the first conductivity-type semiconductor may be electrically connected to the first electrode. In this case, the phase change memory cell may further include a word line electrically connected to the second conductivity-type semiconductor of the cell diode.

In other embodiments, the first electrode may be a titanium nitride layer (TiN) or a titanium aluminum nitride layer (TiAlN). In still other embodiments, the second electrode may be a titanium nitride layer (TiN). In yet other embodiments, the undoped GeBiTe layer or the doped GeBiTe layer may have a composition ratio within a range surrounded by four points (B1($Ge_{30.77}$, $Bi_{15.38}$, $Te_{53.85}$), B2($Ge_{48.7}$, $Bi_{1.0}$, $Te_{50.3}$), B3($Ge_{59.3}$, $Bi_{0.5}$, $Te_{40.2}$) and B4($Ge_{38.7}$, $Bi_{16.1}$, $Te_{45.2}$)) represented by coordinates on a triangular composition diagram having vertices of Ge, Bi and Te.

In still other embodiments, the undoped GeBiTe layer or the doped GeBiTe layer may have a composition ratio within a range surrounded by six points (C1($Ge_{33.33}$, $Bi_{13.34}$, $Te_{53.33}$), C2($Ge_{48.7, Bi1.0}$, $Te_{50.3}$), C3($Ge_{54.43}$, $Bi_{0.47}$, $Te_{45.1}$), C4($Ge_{59.3}$, $Bi_{0.5}$, $Te_{40.2}$), C5($Ge_{47.1}$, $Bi_{9.8}$, $Te_{43.1}$) and C6($Ge_{44}$, $Bi_9$, $Te_{47}$)) represented by coordinates on a triangular composition diagram having vertices of Ge, Bi and Te.

The impurity may include at least one element selected from the group consisting of nitrogen (N), carbon (C), selenium (Se), indium (In), oxygen (O), gallium (Ga), silicon (tin), stannum (Sn), lead (Pb), phosphorus (P), arsenic (As), antimony (Sb) and sulfur (S). Content of the impurity may be within the range from 0.01 atomic % to 20 atomic %.

According to another embodiment of the invention, a phase change memory device may include a GeBiTe layer or a doped GeTe layer as a phase change material layer. The phase change memory device includes a semiconductor substrate having a cell array area and a peripheral circuit area and an interlayer insulating layer formed on the semiconductor substrate. A first electrode and a second electrode are disposed on the interlayer insulating layer in the cell array area. A phase change material layer is disposed between the first and second electrodes. The phase change material layer comprises one of an undoped GeBiTe layer, a doped GeBiTe layer containing an impurity and a doped GeTe layer containing an impurity. The undoped GeBiTe layer has a composition ratio within a range surrounded by four points (A1($Ge_{21.43}$, $Bi_{16.67}$, $Te_{61.9}$), A2($Ge_{44.51}$, $Bi_{0.35}$, $Te_{55.14}$), A3($Ge_{59.33}$, $Bi_{0.5}$, $Te_{40.17}$) and A4($Ge_{38.71}$, $Bi_{16.13}$, $Te_{45.16}$)) represented by coordinates on a triangular composition diagram having vertices of germanium (Ge), bismuth (Bi) and tellurium (Te), and the doped GeBiTe layer contains an impurity and has a composition ratio within a range surrounded by four points (D1($Ge_{10}$, $Bi_{20}$, $Te_{70}$), D2($Ge_{30}$, $Bi_0$, $Te_{70}$), D3($Ge_{70}$, $Bi_0$, $Te_{30}$) and D4($Ge_{50}$, $Bi_{20}$, $Te_{30}$)) represented by coordinates on the triangular composition diagram. Also, the doped GeTe layer contains an impurity and has a composition ratio corresponding to coordinates on a straight line between the points D2 and D3. A bit line is disposed on the interlayer insulating layer. The bit line is electrically connected to the second electrode.

In still another aspect, the invention is directed to an electronic system employing a phase change memory cell, which has an undoped GeBiTe layer, a doped GeBiTe layer or a doped GeTe layer. The electronic system includes a processor, an input and output unit performing data communication with the processor and a phase change memory device performing data communication with the processor. The phase change memory device includes a semiconductor substrate having a cell array area and a peripheral circuit area and an interlayer insulating layer formed on the semiconductor substrate. A first electrode and a second electrode are disposed in the interlayer insulating layer in the cell array area. A phase change material pattern is disposed between the first and second electrodes. The phase change material pattern may be an undoped GeBiTe layer, a doped GeBiTe layer containing an impurity or a doped GeTe layer containing an impurity. The undoped GeBiTe layer has a composition ratio within a range surrounded by four points (A1($Ge_{21.43}$, $Bi_{16.67}$, $Te_{61.9}$), A2($Ge_{44.51}$, $Bi_{0.35}$, $Te_{55.14}$), A3($Ge_{59.33}$, $Bi_{0.5}$, $Te_{40.17}$) and A4($Ge_{38.71}$, $Bi_{16.13}$, $Te_{45.16}$)) represented by coordinates on a triangular composition diagram having vertices of Ge, Bi and Te, and the doped GeBiTe layer contains an impurity and has a composition ratio within a range surrounded by four points (D1($Ge_{10}$, $Bi_{20}$, $Te_{70}$), D2($Ge_{30}$, $Bi_0$, $Te_{70}$), D3($Ge_{70}$, $Bi_0$, $Te_{30}$) and D4($Ge_{50}$, $Bi_{20}$, $Te_{30}$)) represented by coordinates on the triangular composition diagram. Also, the doped GeTe layer contains an impurity and has a composition ratio corresponding to coordinates on a straight line between the points D2 and D3. A bit line is disposed on the interlayer insulating layer. The bit line is electrically connected to the second electrode.

Additional embodiments of the invention include a method of fabricating a phase change memory cell that is capable of increasing an electrical programming speed and decreasing a reset current. The method includes forming a lower interlayer insulating layer on a semiconductor substrate and forming a first electrode in the lower interlayer insulating layer. A phase change material layer contacting the first electrode and a second electrode stacked on the phase change material layer are formed on the lower interlayer insulating layer. The phase change material layer is formed of one of an undoped GeBiTe layer having a composition ratio within a range surrounded by four points (A1($Ge_{21.43}$, $Bi_{16.67}$, $Te_{61.9}$), A2($Ge_{44.51}$, $Bi_{0.35}$, $Te_{55.14}$), A3($Ge_{59.33}$, $Bi_{0.5}$, $Te_{40.17}$) and A4($Ge_{38.71}$, $Bi_{16.13}$, $Te_{45.16}$)) represented by coordinates on a triangular composition diagram having vertices of Ge, Bi and Te, a doped GeBiTe layer containing an impurity and having a composition ratio within a range surrounded by four points (D1($Ge_{10}$, $Bi_{20}$, $Te_{70}$), D2($Ge_{30}$, $Bi_0$, $Te_{70}$), D3($Ge_{70}$, $Bi_0$, $Te_{30}$) and D4($Ge_{50}$, $Bi_{20}$, $Te_{30}$)) represented by coordinates on the triangular composition diagram, and a doped GeTe layer containing an impurity and having a composition ratio corresponding to coordinates on a straight line between the points D2 and D3. An upper interlayer insulating layer is formed on the substrate having the phase change material layer and the second electrode. The upper interlayer insulating layer is patterned to form a bit line contact hole exposing the second electrode. A bit line electrically connected to the second electrode through the bit line contact hole is formed on the upper interlayer insulating layer.

BRIEF DESCRIPTION OF THE DRAWINGS

The foregoing and other objects, features and advantages of the invention will be apparent from the more particular description of a preferred embodiment of the invention, as illustrated in the accompanying drawing. The drawing is not necessarily to scale, emphasis instead being placed upon illustrating the principles of the invention.

DETAILED DESCRIPTION OF THE INVENTION

Figure 1:
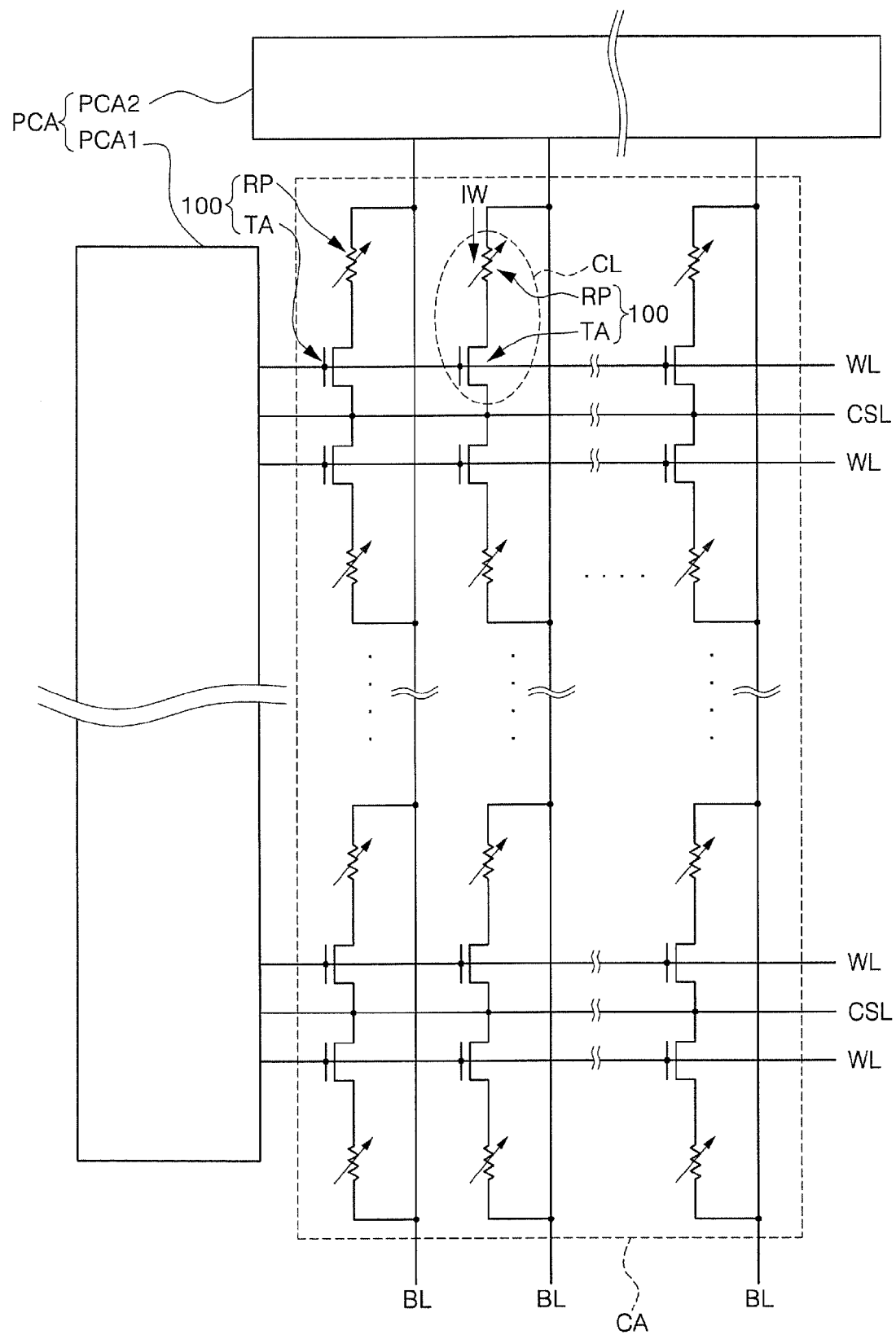
FIG. 1 is a schematic block diagram of a phase change memory device employing phase change memory cells according to an exemplary embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

FIG. 1 is a schematic block diagram of a phase change memory device employing phase change memory cells according to an exemplary embodiment of the present invention. Referring to FIG. 1, the phase change memory device includes a cell array area CA and a peripheral circuit area PCA. The cell array area CA (i.e., a memory cell region) includes a plurality of word lines WL, a plurality of bit lines BL and a plurality of phase change memory cells 100. The bit lines BL may be disposed to intersect the word lines WL, and the phase change memory cells 100 are disposed at intersections between the word lines WL and the bit lines BL, respectively. Also, the peripheral circuit area PCA comprises first and second integrated circuits PCA1 and PCA2 for driving the phase change memory cells 100. The first integrated circuit PCA1 may include a row decoder for selecting one of the word lines WL, and the second integrated circuit PCA2 may include a column decoder for selecting one of the bit lines BL.

Each of the phase change memory cells 100 includes a phase change resistor RP electrically connected to one of the bit lines BL and a switching device electrically connected to the phase change resistor RP. The phase change resistor RP may include first and second terminals and a phase change material layer interposed between the first and second terminals, and the switching device may be a metal oxide semiconductor (MOS) transistor TA having a gate electrode, a source region and a drain region. In this case, the first terminal of the phase change resistor RP is electrically connected to the drain region of the MOS transistor TA, and the second terminal of the phase change resistor RP is electrically connected to the bit line BL. Also, the gate electrode of the MOS transistor TA is electrically connected to one of the word lines WL, and the source region of the MOS transistor TA is electrically connected to a common source line CSL.

In order to selectively store data in a single cell CL of the phase change memory cells 100, the MOS transistor TA of the selected cell CL is turned on and a write current $I_w$ is forced through the bit line BL connected to the selected cell CL. In this case, an electrical resistance of the phase change resistor RP may be changed depending on the amount of the write current $I_W$. For example, when the phase change material is heated to a temperature between its crystallization temperature and melting point by the write current $I_w$ and the heated phase change material is cooled down, the phase change material is transformed into a crystalline state. In contrast, when the phase change material is heated to a higher temperature than the melting point by the write current $I_w$ and the melted phase change material is abruptly quenched, the phase change material is transformed into an amorphous state. A resistivity of the phase change material having the crystalline state is lower than that of the phase change material having the amorphous state. Accordingly, by detecting a current flowing through the phase change material in a read mode, it can be determined whether the data stored in the phase change resistor RP is a logic "1" or a logic "0".

Figure 2:
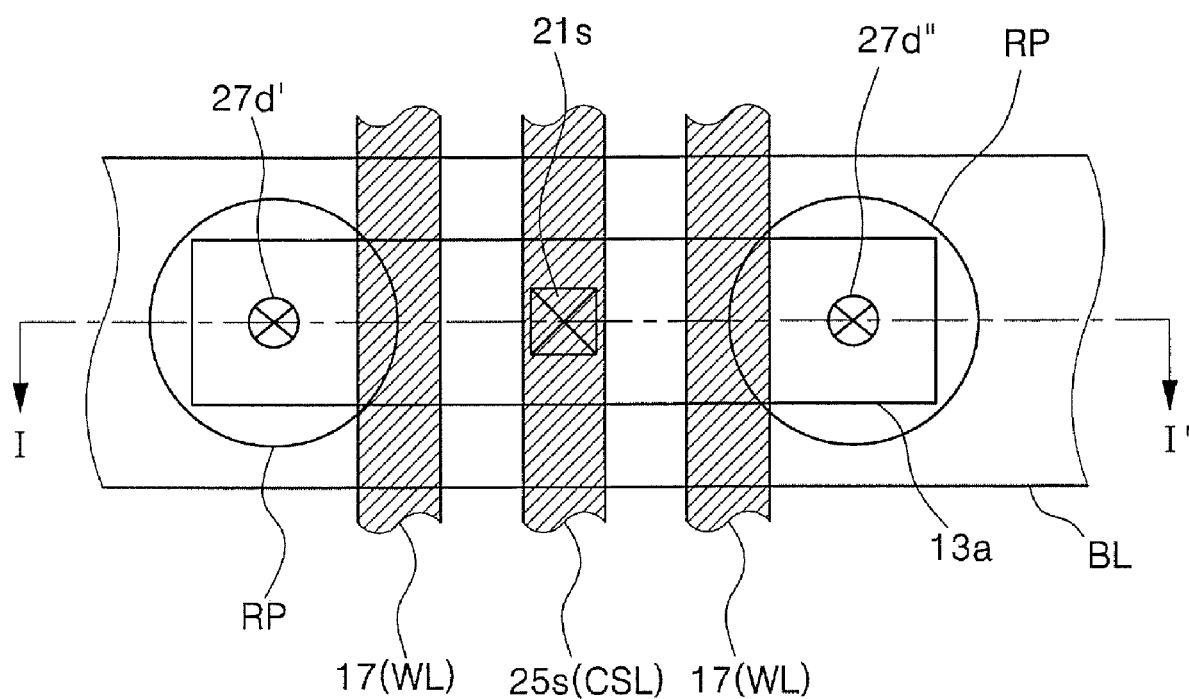
FIG. 2 is a plan view of a portion of a cell array area shown in FIG. 1.
Figure 3:
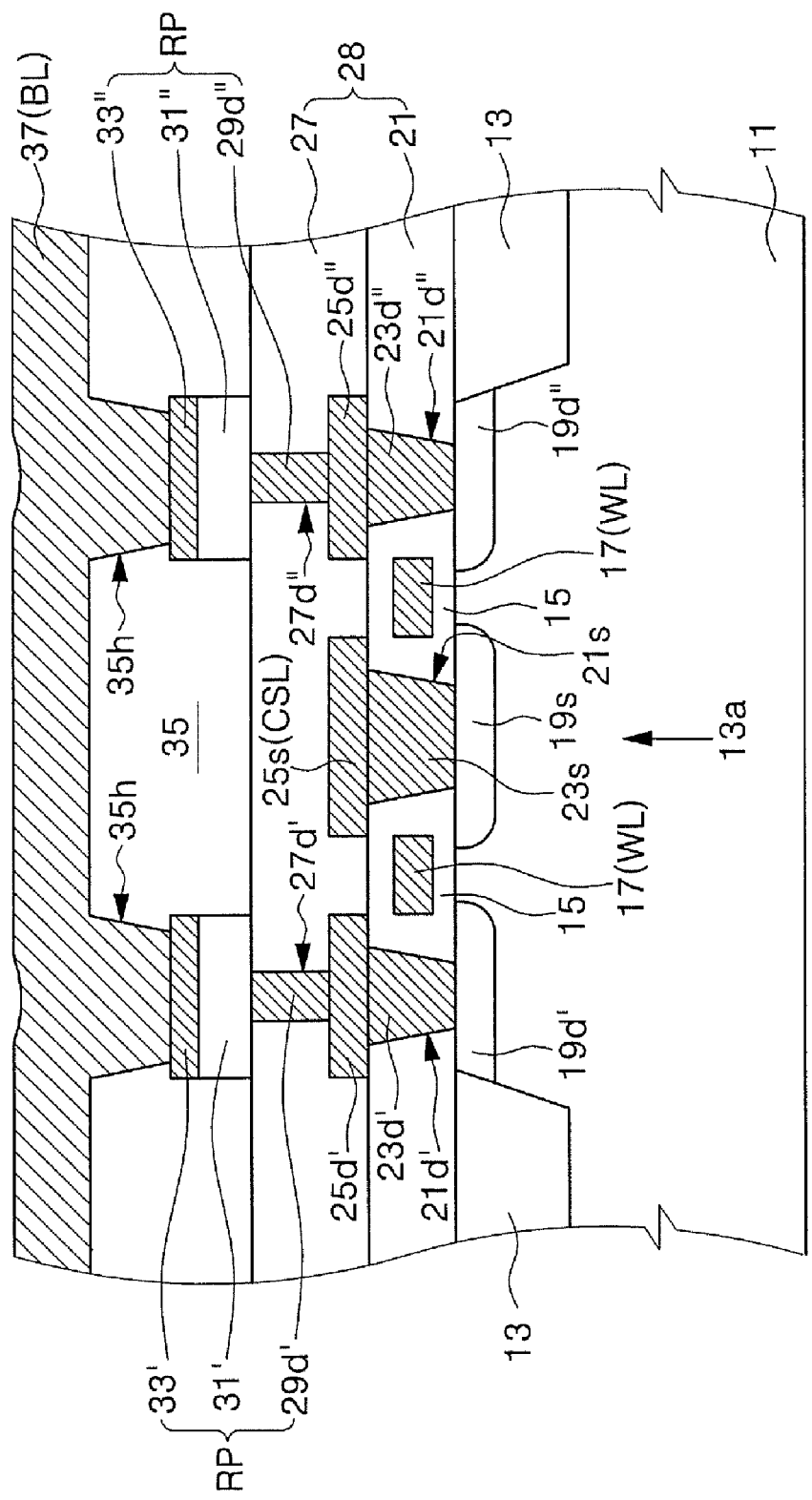
FIG. 3 is a cross-sectional view taken along line I-I' of FIG. 2.

FIG. 2 is a plan view of a portion of the cell array area (CA) shown in FIG. 1, and FIG. 3 is a cross-sectional view taken along line I-I' of FIG. 2. Referring to FIGS. 2 and 3, an isolation layer 13 is disposed in a predetermined region of a semiconductor substrate 11 to define a cell active region 13a. A pair of switching devices are disposed on the cell active region 13a. The pair of switching devices may be a pair of MOS transistors or a pair of bipolar transistors. The pair of MOS transistors include first and second drain regions 19d' and 19d'' respectively formed in both ends of the cell active region 13a, a common source region 19s formed in a central portion of the cell active region 13a, and a pair of word lines 17 (WL of FIG. 1) crossing over the cell active region 13a. One of the pair of word lines 17 is disposed over a channel region between the first drain region 19d' and the common source region 19s, and the other of the pair of word lines 17 is disposed over a channel region between the second drain region 19d'' and the common source region 19s. The word lines 17 are electrically insulated from the channel regions by a gate dielectric layer 15.

A first lower interlayer insulating layer 21 is disposed on the substrate having the pair of MOS transistors formed thereon. A common source line 25s (CSL of FIG. 1), a first drain pad 25d', and a second drain pad 25d'' are disposed on the first lower interlayer insulating layer 21. The common source line 25s may be disposed parallel to the word lines 17. The common source line 25s may be electrically connected to the common source region 19s through a common source line contact hole 21s penetrating the first lower interlayer insulating layer 21, and the first and second drain pads 25d' and 25d'' may be electrically connected to the first and second drain regions 19d' and 19d'' through first and second drain contact holes 21d' and 21d'' penetrating the first lower interlayer insulating layer 21, respectively.

In another exemplary embodiment, the common source line contact hole 21s, the first drain contact hole 21d' and the second drain contact hole 21d'' may be filled with a common source line contact plug 23s, a first drain contact plug 23d' and a second drain contact plug 23d'', respectively. In this case, the common source line 25s, the first drain pad 25d' and the second drain pad 25d'' may be electrically connected to the common source region 19s, the first drain region 19d' and the second drain region 19d'' through the common source line contact plug 23s, the first drain contact plug 23d' and the second drain contact plug 23d", respectively.

A second lower interlayer insulating layer 27 is disposed on the substrate having the common source line 25s, the first drain pad 25d' and the second drain pad 25d" formed thereon. The first drain pad 25d' and the second drain pad 25d" may be exposed by first and second phase change resistor contact holes 27d' and 27d" penetrating the second lower interlayer insulating layer 27, respectively. First and second bottom electrodes 29d' and 29d" may be disposed in the first and second phase change resistor contact holes 27d' and 27d", respectively. The first and second bottom electrodes 29d' and 29d" may be a titanium nitride layer (TiN) or a titanium aluminum nitride layer (TiAlN). The first lower interlayer insulating layer 21 and the second lower interlayer insulating layer 27 constitute a lower interlayer insulating layer 28.

First and second phase change material layers 31' and 31" are disposed on the second lower interlayer insulating layer 27. The first and second phase change material layers 31' and 31" are disposed to be in contact with the first and second bottom electrodes 29d' and 29d", respectively. Also, first and second top electrodes 33' and 33" may be disposed on the first and second phase change material layers 31' and 31", respectively. The first and second top electrodes 33' and 33" may be a TiN layer. The first bottom electrode 29d', the first phase change material layer 31' and the first top electrode 33' constitute a phase change resistor RP, and the second bottom electrode 29d", the second phase change material layer 31" and the second top electrode 33" constitute another phase change resistor RP. The first and second bottom electrodes 29d' and 29d" correspond to first electrodes of the phase change resistors RP, and the first and second top electrodes 33' and 33" correspond to second electrodes of the phase change resistors RP.

Top surfaces of the first electrodes 29d' and 29d" may have substantially the same level as the top surface of the second lower interlayer insulating layer 27. In this case, the phase change resistors RP may correspond to T-shaped phase change resistors as shown in FIG. 3. Alternatively, the top surfaces of the first electrodes 29d' and 29d" may be lower than the top surface of the second lower interlayer insulating layer 27. In this case, the phase change resistors RP may correspond to confined phase change resistors.

The phase change material layers 31' and 31" may be an alloy layer of Ge, Bi and Te (i.e., GeBiTe layer). In more detail, the phase change material layers 31' and 31" may be a GeBiTe layer having a composition ratio within a specific range on a triangular composition diagram having vertices of Ge, Bi and Te, as shown in FIG. 4A.

Figure 4A:
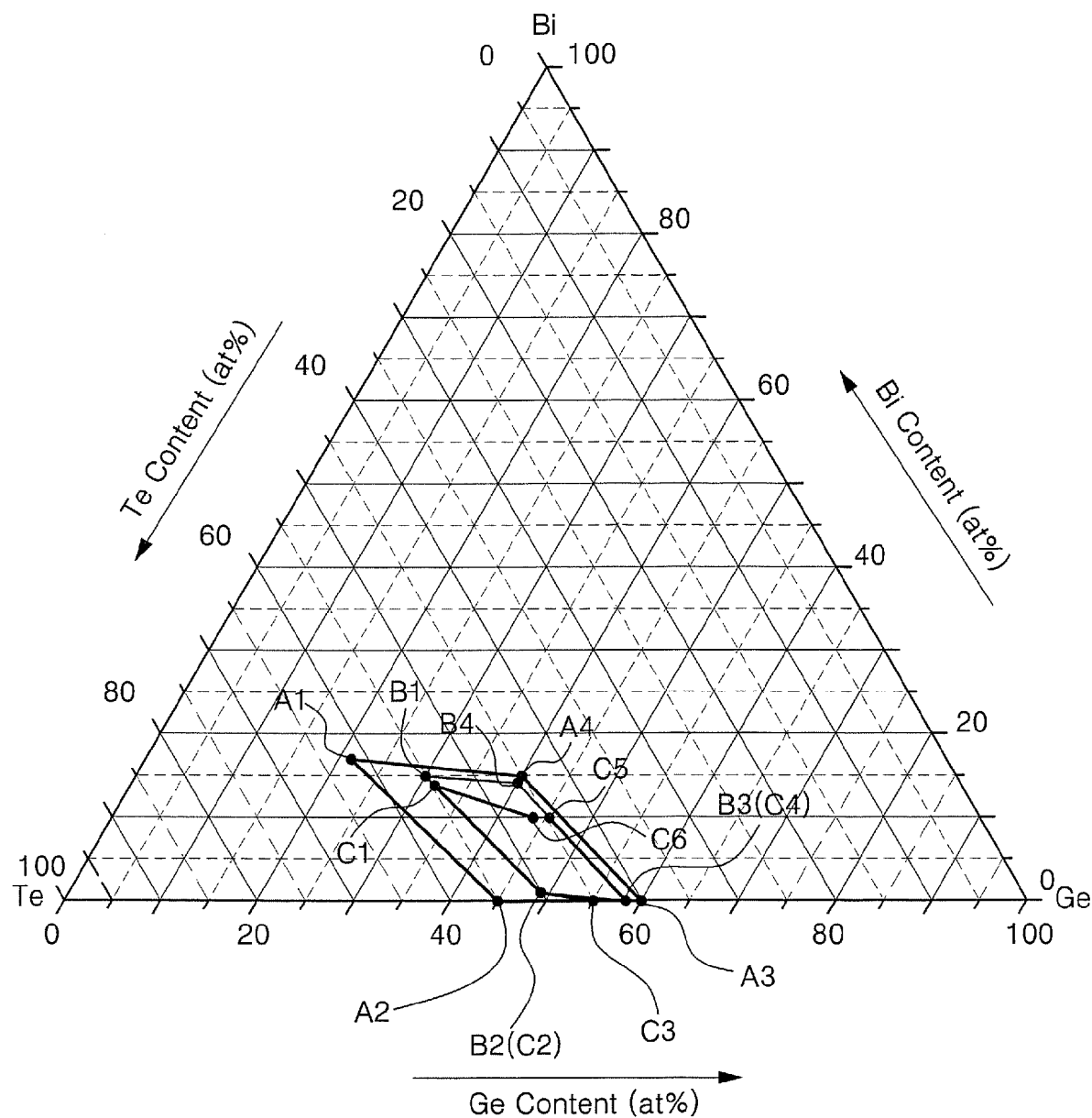
FIG. 4A is a triangular composition diagram illustrating a composition range of a phase change material layer employed in phase change memory cells according to exemplary embodiments of the present invention.

Referring to FIG. 4A, the phase change material layers 31' and 31" according to an exemplary embodiment of the present invention may be a GeBiTe layer having a composition ratio within a range surrounded by the following four points A1, A2, A3 and A4 represented by coordinates on a triangular composition diagram having vertices of Ge, Bi and Te:

A1($Ge_{21.43}$, $Bi_{16.67}$, $Te_{61.9}$)
A2($Ge_{44.51}$, $Bi_{0.35}$, $Te_{55.14}$)
A3($Ge_{59.33}$, $Bi_{0.5}$, $Te_{40.17}$)
A4($Ge_{38.71}$, $Bi_{16.13}$, $Te_{45.16}$)

The phase change material layer 31' or 31" formed of the GeBiTe layer having the above-described composition exhibits some advantages over the conventional GeSbTe layer in terms of an electrical signal characteristic required to transform a crystalline stricture of the phase change material layer 31' or 31". For example, a set pulse width required to transform the phase change material layer 31' or 31" formed of the GeBiTe layer having the above-described composition ratio into a crystalline state is smaller than a set pulse width required to transform the conventional GeSbTe layer into a crystalline state. In general, a time (i.e., a set pulse width) required to transform a phase change material layer such as a GeSbTe layer or a GeBiTe layer into a crystalline state is greater than a time (i.e., a reset pulse width) required to transform the phase change material into an amorphous state. Therefore, the present invention can provide an improved phase change memory cell showing a faster program time than a phase change memory cell employing the conventional GeSbTe layer as a phase change material layer.

In addition, a magnitude of the reset pulse required to transform the phase change material layer formed of the GeBiTe layer having the above-described composition ratio into an amorphous state, that is, a reset current, is smaller than a reset current required to transform the conventional GeSbTe layer into an amorphous state. In general, a current (i.e., a reset current) required to transform a phase change material layer such as a GeSbTe layer or a GeBiTe layer into an amorphous state is greater than a current (i.e., a set current) required to transform the phase change material layer into a crystalline state. Therefore, the present invention can provide an improved phase change memory cell showing a smaller power consumption than the phase change memory cell employing the conventional GeSbTe layer as a phase change material layer in a write mode (i.e., a program mode).

Preferably, the phase change material layers 31' and 31" may be a GeBiTe layer having a composition ratio within a range surrounded by the following four points B1, B2, B3 and B4, as shown in FIG. 4A:

B1($Ge_{30.77}$, $Bi_{15.38}$, $Te_{53.85}$)
B2($Ge_{48.7}$, $Bi_{1.0}$, $Te_{50.3}$)
B3($Ge_{59.3}$, $Bi_{0.5}$, $Te_{40.2}$)
B4($Ge_{38.7}$, $Bi_{16.1}$, $Te_{45.2}$)

More preferably, the phase change material layers 31' and 31" may be a GeBiTe layer having a composition ratio within a range surrounded by the following six points C1, C2, C3, C4, C5 and C6, as shown in FIG. 4A.

C1($Ge_{33.33}$, $Bi_{13.34}$, $Te_{53.33}$)
C2($Ge_{48.7}$, $Bi_{1.0}$, $Te_{50.3}$)
C3($Ge_{54.43}$, $Bi_{0.47}$, $Te_{45.1}$)
C4($Ge_{59.3}$, $Bi_{0.5}$, $Te_{40.2}$)
C5($Ge_{47.1}$, $Bi_{9.8}$, $Te_{43.1}$)
C6($Ge_{44}$, $Bi_9$, $Te_{47}$)

Figure 4B:
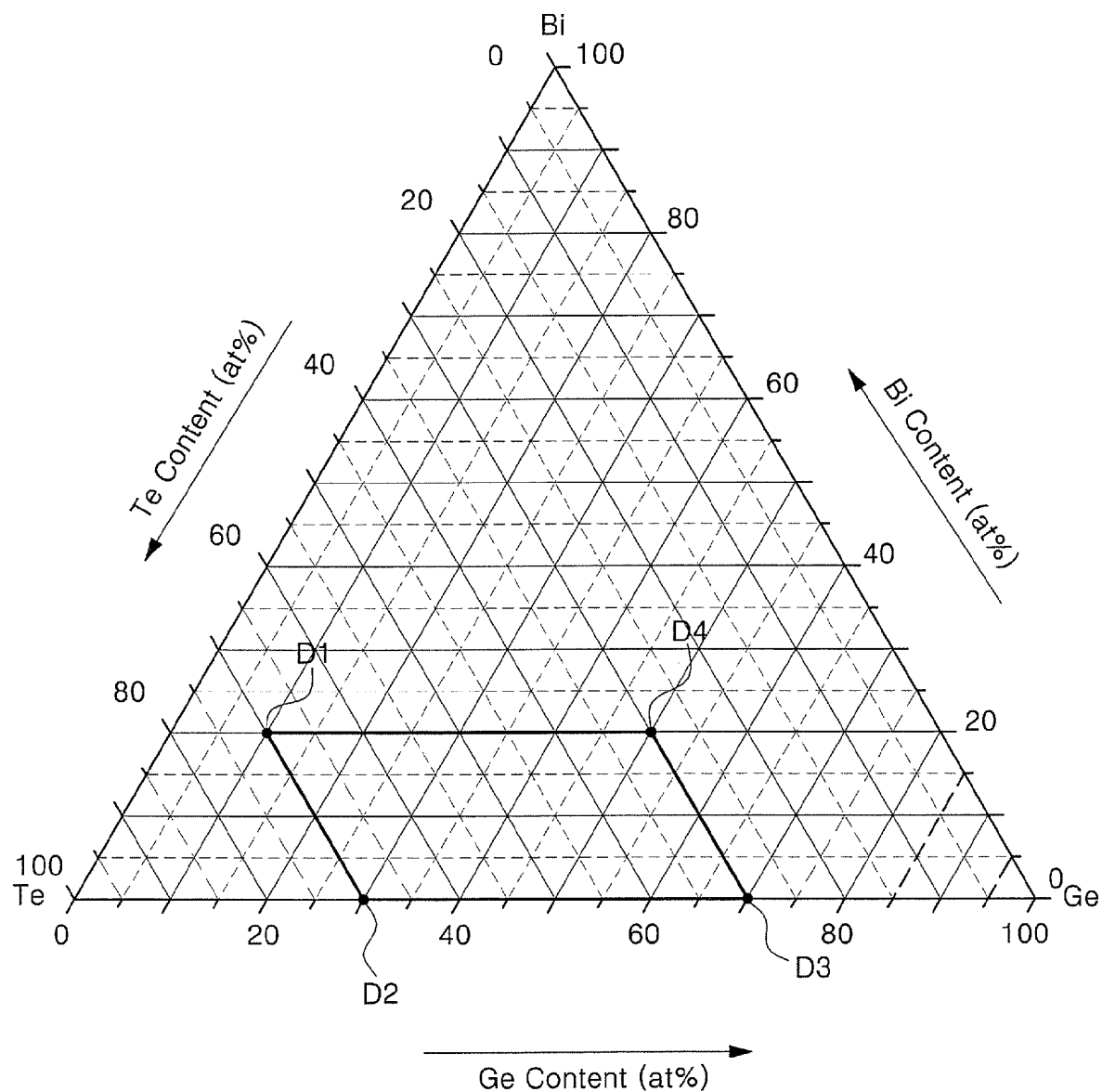
FIG. 4B is a triangular composition diagram illustrating a composition range of a phase change material layer employed in phase change memory cells according to other exemplary embodiments of the present invention.

In another exemplary embodiment of the present invention, the phase change material layer 31' or 31" may be a doped GeBiTe layer or a doped GeTe layer which contains an impurity. The impurity may be at least one element selected from the group consisting of nitrogen (N), carbon (C), selenium (Se), indium (In), oxygen (O), gallium (Ga), silicon (Si), tin (Sn), lead (Pb), phosphorus (P), arsenic (As), antimony (Sb) and sulfur (S). In this case, the content of the impurity may be in a range of 0.01 atomic % to 20 atomic %. As shown in FIG. 4B, the doped GeBiTe layer or the doped GeTe layer may have a composition ratio in a wider range than the undoped GeBiTe layer shown in FIG. 4A.

Referring to FIG. 4B, the doped GeBiTe layer or the doped GeTe layer may have a composition ratio in a range surrounded by the following four points D1, D2, D3 and D4 represented by coordinates on a triangular composition diagram having vertices of Ge, Bi and Te:

D1($Ge_{10}$, $Bi_{20}$, $Te_{70}$)
D2($Ge_{30}$, $B_0$, $Te_{70}$)
D3($Ge_{70}$, $B_0$, $Te_{30}$)
D4($Ge_{50}$, $Bi_{20}$, $Te_{30}$)

Here, phase change material layers having composition ratios represented by coordinates on the straight line between the points D2 and D3 mean the doped GeTe layers. That is, the doped GeTe layer does not contain Bi.

The doped GeBiTe layer has small and uniform grains as compared to an undoped GeBiTe layer. As a result, the doped GeBiTe layer may have an improved characteristic as compared to the undoped GeBiTe layer in terms of both a reset current and a set pulse width. In contrast, when the conventional GeSbTe layer is doped with an impurity such as nitrogen or silicon, the set pulse width of the doped GeSbTe layer tends to increase even though the reset current of the doped GeSbTe layer decreases.

Referring again to FIGS. 2 and 3, an upper interlayer insulating layer 35 is disposed on the substrate having the phase change resistors RP. A bit line 37 (BL of FIG. 1) is disposed on the upper interlayer insulating layer 35, and the bit line 37 is electrically connected to the first and second top electrodes 33' and 33" through bit line contact holes 35h penetrating the upper interlayer insulating layer 35. The bit line 37 may be disposed to cross over the word lines 17.

A method of forming the phase change memory cells shown in FIGS. 2 and 3 includes forming an isolation layer 13 in a predetermined region of a semiconductor substrate 11 to define a cell active region 13a. A gate dielectric layer 15 is formed on the cell active region 13a, and a gate conductive layer is formed on the substrate having the gate dielectric layer 15 formed thereon. The gate conductive layer is patterned to form a pair of gate electrodes (i.e., a pair of word lines 17) crossing the cell active region 13a. Impurity ions are implanted into the cell active region 13a using the word lines 17 as ion implantation masks to form a common source region 19s as well as first and second drain regions 19d' and 19d". The common source region 19s is formed in the cell active region 13a between the word lines WL, and the first and second drain regions 19d' and 19d" are formed at both ends of the cell active region 13a, respectively. Consequently, a pair of MOS transistors (TA of FIG. 1) are formed in the cell active region 13a.

A first lower interlayer insulating layer 21 is formed on the substrate having the access MOS transistors formed thereon. The first lower interlayer insulating layer 21 is patterned to form a first drain contact hole 21d', a second drain contact hole 21d" and a common source line contact hole 21s which expose the first drain region 19d', the second drain region 19d" and the common source region 19s, respectively. A first drain contact plug 23d', a second drain contact plug 23d" and a common source line contact plug 23s may be formed in the first drain contact hole 21d', the second drain contact hole 21d" and the common source line contact hole 21s, respectively. The contact plugs 23d', 23d" and 23s may be formed of a conductive layer such as a tungsten layer or a doped polysilicon layer.

A conductive layer is formed on the substrate having the contact plugs 23d', 23d" and 23s, and the conductive layer is patterned to form a common source line 25s, a first drain pad 25d' and a second drain pad 25d". A second lower interlayer insulating layer 27 is formed on the substrate having the common source line 25s, the first drain pad 25d' and the second drain pad 25d". The first and second lower interlayer insulating layers 21 and 27 constitute a lower interlayer insulating layer 28.

The second lower interlayer insulating layer 27 is patterned to form first and second phase change resistor contact holes 27d' and 27d" which expose the first and second drain pads 25d' and 25d", respectively. First and second bottom electrodes 29d' and 29d" are formed in the first and second phase change resistor contact holes 27d' and 27d", respectively. The first and second bottom electrodes 29d' and 29d" may be formed of a titanium nitride layer (TiN) or a titanium aluminum nitride layer (TiAlN). The first and second bottom electrodes 29d' and 29d" may be formed to have top surfaces which are located at the same level as the top surface of the second lower interlayer insulating layer 27. Alternatively, the top surfaces of the first and second bottom electrodes 29d' and 29d" may be lower than the top surface of the second lower interlayer insulating layer 27.

A phase change material layer and a top electrode layer are sequentially formed on the second lower interlayer insulating layer 27 and the first and second bottom electrodes 29d' and 29d". The top electrode layer may be formed of a titanium nitride layer (TiN), and the phase change material layer may be formed of an undoped GeBiTe layer having a composition ratio shown in FIG. 4A or a doped GeBiTe layer having a composition ratio shown in FIG. 4B. The undoped GeBiTe layer or the doped GeBiTe layer may be formed using a physical vapor deposition (PVD) technique, a chemical vapor deposition (CVD) technique, or an atomic layer deposition (ALD) technique.

When an impurity of the doped GeBiTe layer is nitrogen, the doped GeBiTe layer may be formed by a nitrogen reactive sputtering technique. Similarly, when an impurity of the doped GeBiTe layer is oxygen, the doped GeBiTe layer may be formed using an oxygen reactive sputtering technique.

The top electrode layer and the phase change material layer are patterned to form first and second phase change material layers 31' and 31" covering the respective first and second bottom electrodes 29d' and 29d" as well as first and second top electrodes 33' and 33" stacked on the respective first and second phase change material layers 31' and 31".

An upper interlayer insulating layer 35 is formed on the substrate having the first and second top electrodes 33' and 33" formed thereon, and the upper interlayer insulating layer 35 is patterned to form bit line contact holes 35h exposing the first and second top electrodes 33' and 33". A conductive layer such as a metal layer is then formed on the substrate having the bit line contact holes 35h, and the conductive layer is patterned to form a bit line 37 covering the bit line contact holes 35h.

The undoped GeBiTe layer or the doped GeBiTe layer described with reference to FIGS. 4A and 4B may be applied to phase change memory cells having various structures. For example, the undoped GeBiTe layer or the doped GeBiTe layer may be employed in a phase change memory cell having a cell diode shown in FIG. 5.

Figure 5:
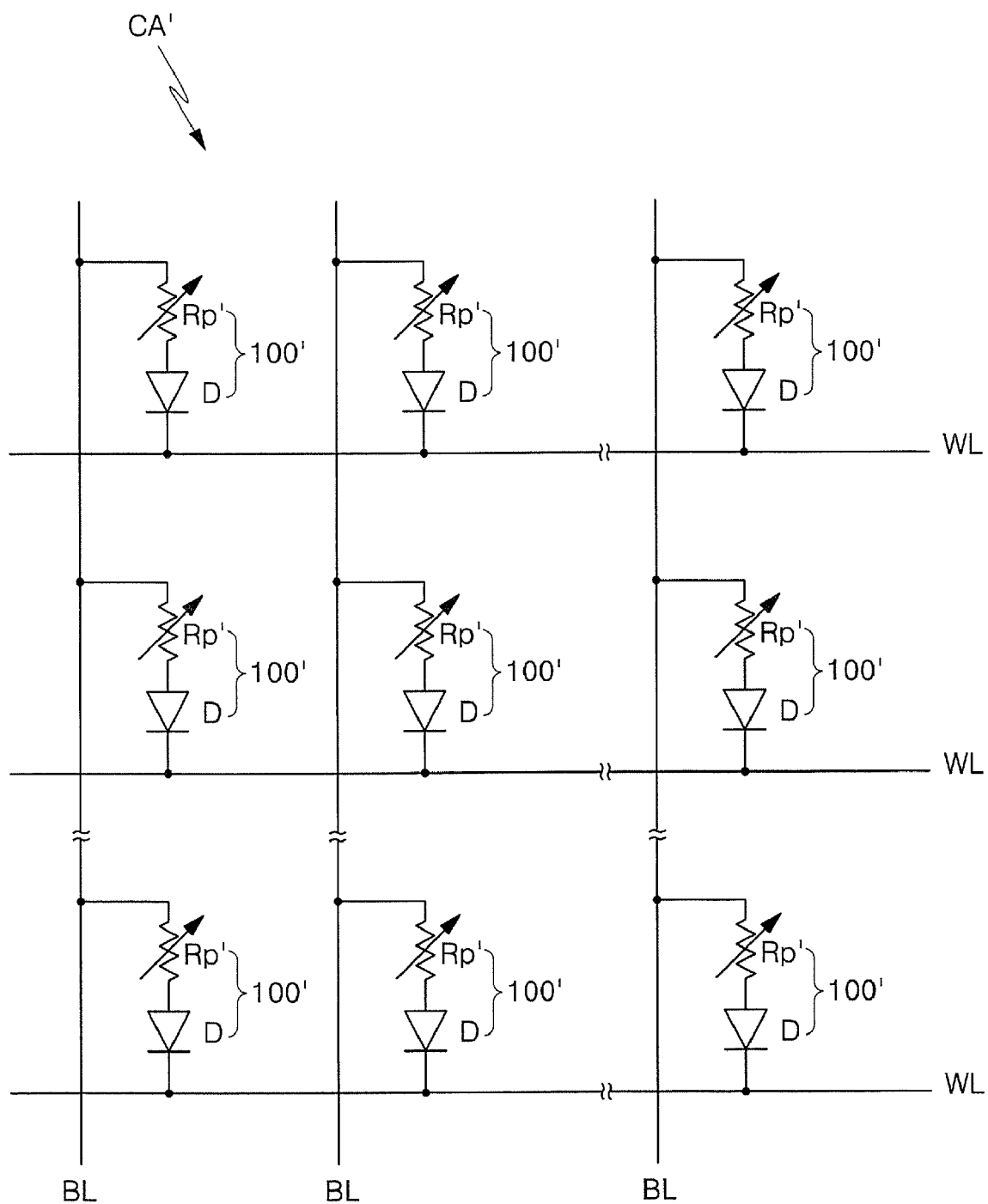
FIG. 5 is an equivalent circuit diagram illustrating another exemplary embodiment of a cell array area shown in FIG. 1.

FIG. 5 is an equivalent circuit diagram illustrating a cell array area CA' composed of phase change memory cells having cell diodes D instead of the MOS transistors TA of FIG. 1. Referring to FIG. 5, the cell array area CA' includes a plurality of bit lines BL and a plurality of word lines WL crossing the plurality of bit lines BL. A plurality of phase change memory cells 100' are disposed at intersections between the bit lines BL and the word lines WL, respectively. Each of the phase change memory cells 100' includes a phase change resistor RP' electrically connected to one of the bit lines BL and a cell diode D electrically connected to the phase change resistor RP'. The phase change resistor RP' has first and second terminals as well as a phase change material layer between the first and second terminals, and the cell diode D has a first conductivity-type semiconductor and an second conductivity-type semiconductor. In this case, the first terminal of the phase change resistor RP' is electrically connected to the first conductivity-type semiconductor of the cell diode D, and the second terminal of the phase change resistor RP' is electrically connected to the bit line BL. Also, the second conductivity-type semiconductor of the cell diode D is electrically connected to one of the word lines WL.

Figure 6:
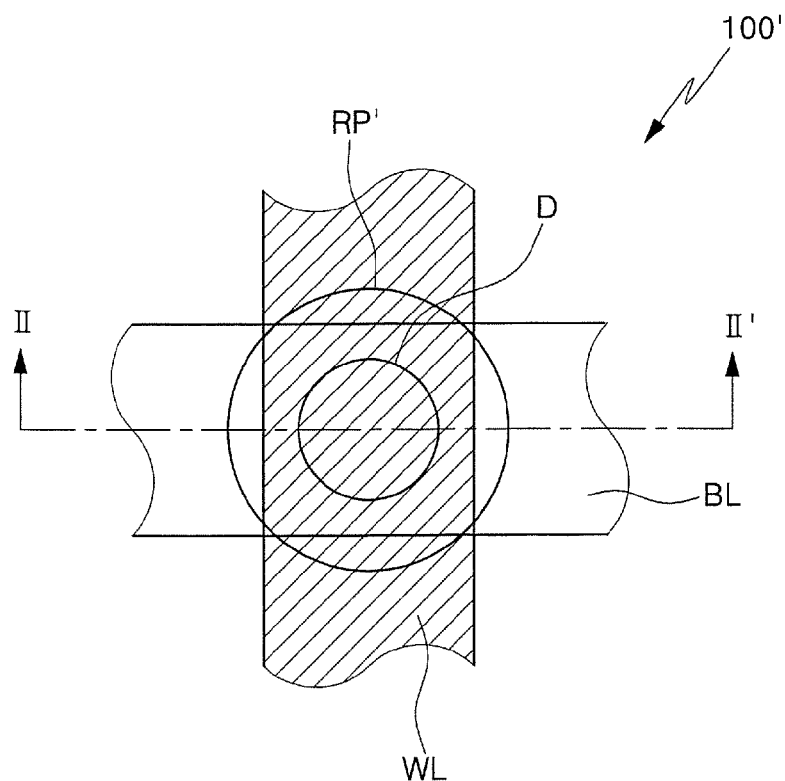
FIG. 6 is a plan view illustrating a unit cell of a cell array area shown in FIG. 5.
Figure 7:
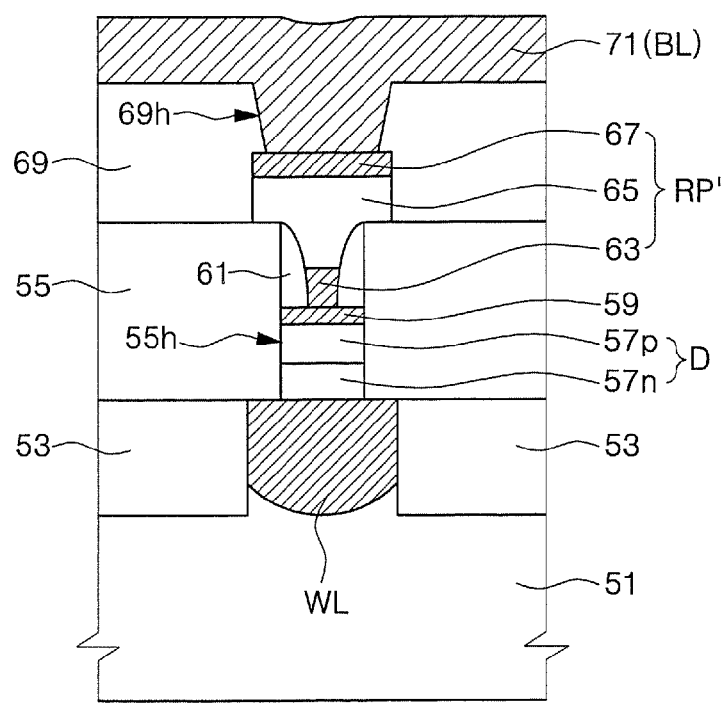
FIG. 7 is a cross-sectional view taken along line II-II' of FIG. 6.

FIG. 6 is a plan view of a unit cell of FIG. 5, and FIG. 7 is a cross-sectional view taken along line II-II' of FIG. 6.

Referring to FIGS. 6 and 7, an isolation layer 53 is disposed in a predetermined region of a semiconductor substrate 51 of a first conductivity type to define a line-shaped active region. The active region may be doped with impurities of a second conductivity type different from the first conductivity type, thereby acting as a word line WL. Alternatively, the word line WL may be a conductive interconnection stacked on the semiconductor substrate 51. The conductive interconnection may be a metal interconnection or an epitaxial semiconductor layer.

A lower interlayer insulating layer 55 is disposed on the word line WL and the isolation layer 53. A predetermined region of the word line WL may be exposed by a cell diode hole 55h penetrating the lower interlayer insulating layer 55. A cell diode D is disposed in the cell diode hole 55h. The cell diode D has an second conductivity-type semiconductor 57n and a first conductivity-type semiconductor 57p, which are sequentially stacked. That is, the cell diode D corresponds to a vertical cell diode. A top surface of the cell diode D may be lower than a top surface of the lower interlayer insulating layer 55. In this case, a bottom electrode 63 is disposed in the cell diode hole 55h on the cell diode D. The bottom electrode 63 may be a titanium nitride layer (TiN) or a titanium aluminum nitride layer (TiAlN). A cell diode electrode 59 may be disposed between the bottom electrode 63 and the first conductivity-type semiconductor 57p. The cell diode electrode 59 may be a metal silicide layer such as a cobalt silicide layer. A sidewall of the bottom electrode 63 may be surrounded by an insulating spacer 61 formed on a sidewall of the cell diode hole 55h.

A phase change material layer 65 and a top electrode 67 are sequentially stacked on the bottom electrode 63. The phase change material layer 65 may be formed of the same material layer as the phase change material layers 31' and 31" described with reference to FIGS. 3, 4A and 4B, and the top electrode 67 may also be formed of the same material layer as the top electrodes 33' and 33" described with reference to FIG. 3. The bottom electrode 63, the phase change material layer 65 and the top electrode 67 constitute a phase change resistor RP'. A top surface of the bottom electrode 63 may be lower than the top surface of the lower interlayer insulating layer 55 as shown in FIG. 7. In this case, the phase change resistor RP' may correspond to a confined phase change resistor. Alternatively, the top surface of the bottom electrode 63 may have the same level as the top surface of the lower interlayer insulating layer 55. In this case, the phase change resistor RP' may correspond to a T-shaped phase change resistor.

An upper interlayer insulating layer 69 is disposed on the substrate having the phase change resistor RP'. A bit line 71 is disposed on the upper interlayer insulating layer 69, and the bit line 71 is electrically connected to the top electrode 67 through a bit line contact hole 69h penetrating the upper interlayer insulating layer 69. The bit line 71 may be disposed to cross over the word line WL.

A method of forming the phase change memory cell shown in FIGS. 6 and 7 will now be described. Referring again to FIGS. 6 and 7, an isolation layer 53 is formed in a predetermined region of a semiconductor substrate 51 of a first conductivity type to define a line-shaped active region. The semiconductor substrate 51 may be a silicon substrate. Impurity ions of a second conductivity type different from the first conductivity type are implanted into the active region to form a word line WL of the second conductivity type. The first and second conductivity types may be a p-type and an n-type, respectively. In another exemplary embodiment of the present invention, the word line WL may be formed of an epitaxial layer or a conductive layer stacked on the semiconductor substrate 51.

A lower interlayer insulating layer 55 is formed on the substrate having the word line WL formed thereon. The lower interlayer insulating layer 55 is patterned to form a cell diode hole 55h exposing a predetermined region of the word line WL. An n-type semiconductor 57n and a p-type semiconductor 57p, which are sequentially stacked, are formed in the cell diode hole 55h. The n-type semiconductor 57n and the p-type semiconductor 57p may be formed using a selective epitaxial growth (SEG) technique, which employs the word line WL as a seed layer. The n-type semiconductor 57n and the p-type semiconductor 57p constitute a cell diode D, i.e., a vertical cell diode. A cell diode electrode 59 may be selectively formed on a surface of the p-type semiconductor 57p. The cell diode electrode 59 may be formed of a metal silicide layer such as a cobalt silicide layer using a self-aligned silicide (salicide) technique, which is well known in the art. A surface of the cell diode electrode 59 may be lower than the top surface of the lower interlayer insulating layer 55.

An insulating spacer 61 may be formed on a sidewall of the cell diode hole 55h on the cell diode electrode 59. A bottom electrode 63 is then formed in the cell diode hole 55h surrounded by the insulating spacer 61. The bottom electrode 63 may be formed of a titanium nitride (TiN) layer or a titanium aluminum nitride (TiAlN) layer. Also, the bottom electrode 63 may be recessed to have a surface lower than the top surface of the lower interlayer insulating layer 55, as shown in FIG. 7. Alternatively, the bottom electrode 63 may be formed to have a surface located at the same level as the top surface of the lower interlayer insulating layer 55.

A phase change material layer and a top electrode layer are sequentially formed on the substrate having the bottom electrode 63. The top electrode layer may be formed of a titanium nitride (TiN) layer, and the phase change material layer may be formed using the same method as described with reference to FIGS. 3, 4A and 4B. The top electrode layer and the phase change material layer are patterned to form a phase change material layer 65 and a top electrode 67 which are sequentially stacked on the bottom electrode 63. The bottom electrode 63, the phase change material layer 65 and the top electrode 67 constitute a phase change resistor RP'.

An upper interlayer insulating layer 69, a bit line contact hole 69h and a bit line 71 are formed on the substrate having the phase change resistor RP' using the same method as described with reference to FIGS. 2 and 3.

Figure 8:
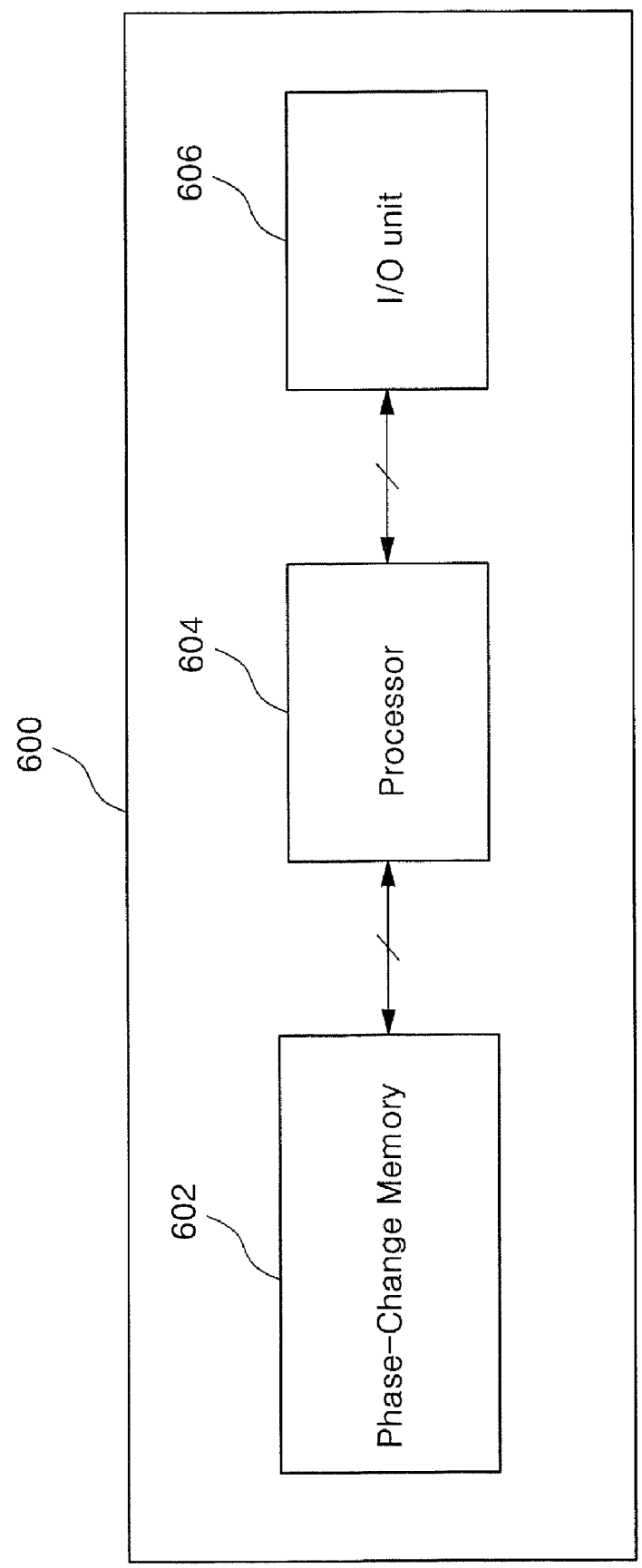
FIG. 8 is a schematic block diagram of an electronic system having a phase change memory device according to an exemplary embodiment of the present invention.

FIG. 8 is a schematic block diagram of an electronic system 600 employing phase change memory cells according to exemplary embodiments of the present invention. Referring to FIG. 8, the electronic system 600 includes at least one phase change memory device 602 acting as data storage media and a processor 604 connected to the phase change memory device 602. Here, the phase change memory device 602 may include phase change memory cells described with reference to FIGS. 1 to 7. The electronic system 600 may correspond to a portable notebook computer, a digital video camera or a cellular phone. In this case, the processor 604 and the phase change memory device 602 are mounted on a board, and the phase change memory device 602 is used as a program memory for storing codes and data for execution of the processor 604.

The electronic system 600 may communicate data with another electronic system such as a personal computer or a computer network through an input and output unit 606. The input and output unit 606 may provide a peripheral bus line of a computer, a high speed digital transmission line or a wireless transmitting and receiving antenna with data. Data communication between the processor 604 and the input/output unit 606 as well as data communication between the processor 604 and the phase change memory device 602 may be achieved using typical computer bus architectures.

Figure 9:
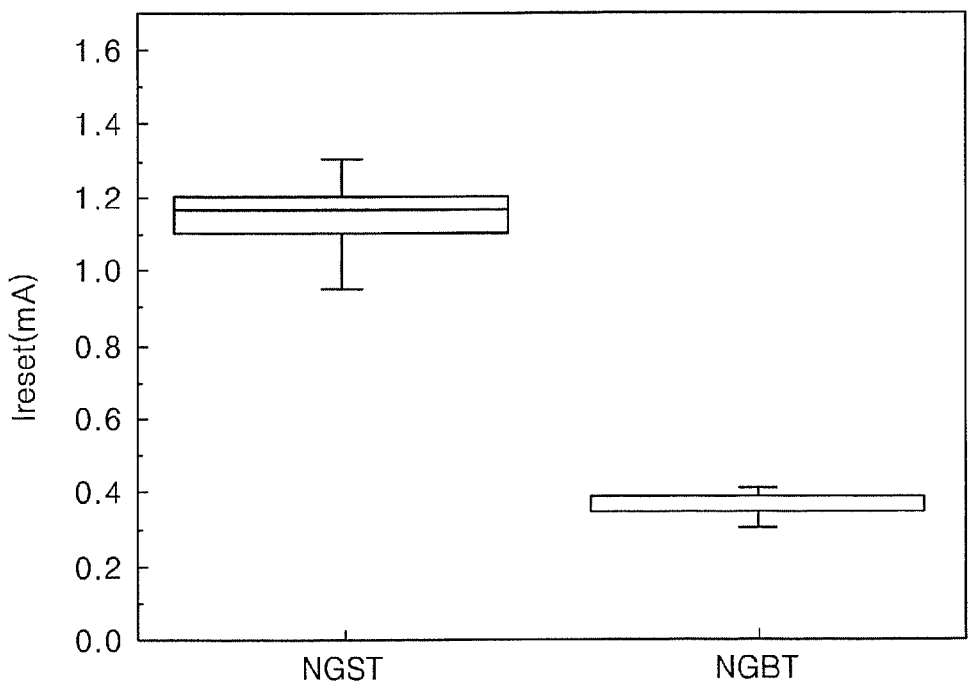
FIG. 9 is a graph illustrating reset current characteristics of phase change memory cells fabricated according to the conventional art and embodiments of the present invention.

FIG. 9 is a graph illustrating reset current characteristics of phase change memory cells fabricated according to the conventional art and embodiments of the present invention. In FIG. 9, a horizontal axis denotes split groups NGST and NGBT, and a vertical axis denotes a reset current Ireset. Here, the split group NGST represents the conventional phase change memory cells, which employ an $N_2$-GeSbTe layer as a phase change material layer, and the split group NGBT repi the phase change memory cells, which employ an $N_2$-doped GeBiTe layer as a phase change material layer in accordance with exemplary embodiments of the present invention.

All phase change memory cells exhibiting measurement results of FIG. 9 were fabricated to have the structure of the T-shaped phase change resistor. Also, widths of the reset pulse and the set pulse applied to the conventional phase change memory cells were 500 nanoseconds (ns), and widths of the reset pulse and the set pulse applied to the phase change memory cells according to the present invention were 10 nanoseconds (ns).

The phase change memory cells showing the measurement results of FIG. 9 were fabricated using process conditions described in Table 1.

TABLE 1

| Process parameter | | Conventional art (NGST) | Present invention (NGBT) |
|---|---|---|---|
| Bottom electrode | | TiAlN layer (diameter: 50 nm) | |
| Phase change material layer | Thickness | 1000 Å | |
| | Composition ratio (at %) | $N_1Ge_{22}Sb_{22}Te_{55}$ | $N_{1.1}Ge_{48.2}Bi_{5.7}Te_{45.0}$ |
| | Diameter | 230 nm | |
| Top electrode | | TiN layer | |

Referring to FIG. 9, a high reset current Ireset of about 1.1 mA to about 1.2 mA was required to reset the conventional phase change memory cells, and a low reset current Ireset of about 0.38 mA was required to reset the phase change memory cells according to the present invention. Therefore, it can be understood that power consumption required to program the phase change memory cells according to the present invention is significantly lower than power consumption required to program the conventional phase change memory cells.

Figure 10:
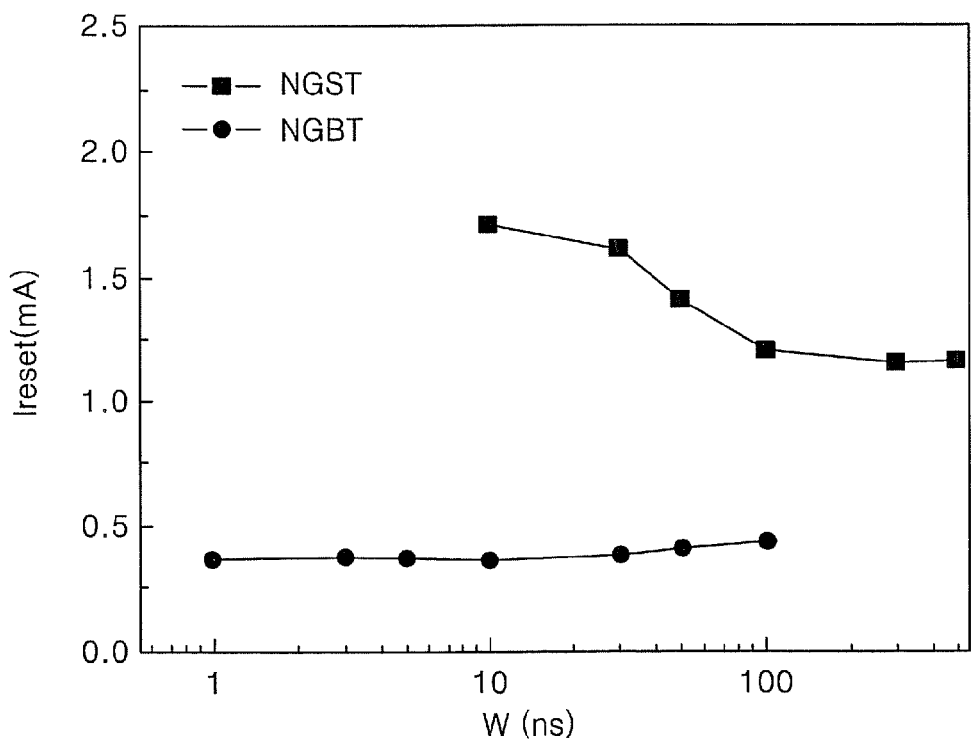
FIG. 10 is a graph illustrating the relationship between a reset current and a reset pulse width of phase change memory cells fabricated according to the conventional art and embodiments of the present invention.

FIG. 10 is a graph illustrating the relationship between a reset current Ireset and a reset current pulse width W of phase change memory cells fabricated according to the conventional art and the present invention. In FIG. 10, a horizontal axis denotes the width W of the reset current pulse, and a vertical axis denotes the reset current Ireset. Phase change memory cells showing the measurement results of FIG. 10 were fabricated using the same process conditions as described in the Table 1. Also, the set pulse and the reset pulse, which have the same width, were continuously applied to measure one reset current of the reset currents shown in FIG. 10.

Referring to FIG. 10, the reset current Ireset of the conventional phase change memory cells was increased from about 1.1 mA to about 1.75 mA when the width W of the reset pulse was decreased from 500 ns to 10 ns. In contrast, the phase change memory cells according to the present invention exhibited a uniform reset current Ireset of about 0.3 mA to about 0.4 mA even when the width W of the reset pulse was decreased from 100 ns to 1 ns. Therefore, a writing speed (programming speed) as well as power consumption of the phase change memory cells according to embodiments of the present invention can be significantly improved.

Figure 11:
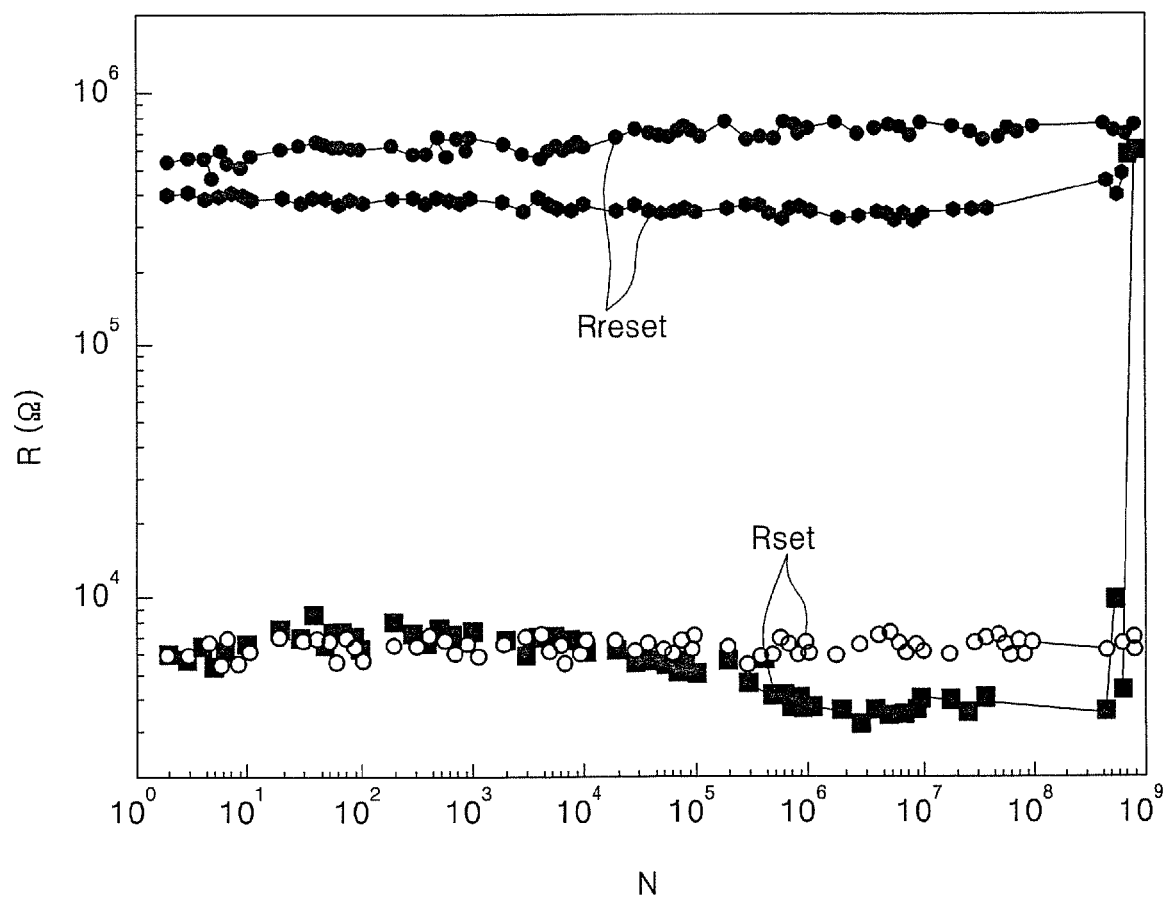
FIG. 11 is a graph illustrating endurance test results of phase change memory cells fabricated according to embodiments of the present invention.

FIG. 11 is a graph illustrating endurance test results of phase change memory cells fabricated according to the present invention. In FIG. 11, a horizontal axis denotes the number of program cycles N of the phase change memory cells (i.e., the number of writing cycles), and a vertical axis denotes a resistance R of a phase change resistor per unit cell. Here, the phase change memory cells were fabricated using the process conditions corresponding to the present invention of Table 1.

The respective program cycles were performed by sequentially applying a single reset pulse and a single set pulse to the phase change resistors of the phase change memory cells. Each of the reset pulse and the set pulse was applied for 10 ns. Also, the reset pulse was generated to have a reset current of about 0.38 mA in order to convert the phase change material layer (i.e., N-doped GeBiTe layer) of the phase change resistor to an amorphous state, and the set pulse was generated to have a set current of about 0.2 mA in order to convert the phase change material layer of the phase change resistor to a crystalline state.

As can be seen from FIG. 11, the phase change memory cells according to embodiments of the present invention show a uniform set resistance $R_{SET}$ of about $3\times10^3\Omega$ to about $8\times10^3\Omega$ and a uniform reset resistance $R_{RESET}$ of about $3\times10^5\Omega$ to about $8\times10^5\Omega$ even when write operations (program operations) of $10^9$ cycles were performed. In particular, any increase of the set resistance $R_{SET}$ and any decrease of the reset resistance $R_{RESET}$ were not observed as shown in FIG. 11 even though the number of program cycles N was increased. That is, the endurance of the phase change memory cells according to embodiments of the present invention was not degraded even when the number of program cycles N was increased.

In addition, the phase change memory cells according to the present invention exhibited a stable set resistance $R_{SET}$ and a stable reset resistance $R_{RESET}$ from the first program cycle, as shown in FIG. 11. That is, most of the conventional phase change memory cells employing the GeSbTe layer necessarily require a firing test before an electrical main program operation is performed, whereas the phase change memory cells according to the present invention exhibit a successful program operation even without any firing test. It can be understood that this is because the GeSbTe layer employed in the conventional phase change memory cell has a metastable phase whereas the GeBiTe layer employed in the phase change memory cell according to the present invention does not have the metastable phase.

Hereinafter, evaluation results of phase change characteristics regarding undoped GeBiTe layers having various composition ratios on the four points A1, A2, A3 and A4 shown in FIG. 4A and within the range surrounded by the four points A1, A2, A3 and A4 will be described. Here, the undoped GeBiTe layers were formed on the substrate using a sputtering technique. The phase change of the undoped GeBiTe layer was accomplished by heating the undoped GeBiTe layer at a temperature between its crystallization temperature and its melting point or a temperature higher than the melting point without using an electrical signal. In this case, the undoped GeBiTe layer was completely transformed into a crystalline state or an amorphous state.

The undoped GeBiTe layers having composition ratios of the points A1, A2, A3 and A4 showed a phase change characteristic described in Table 2.

TABLE 2

| Sample No. (point) | Composition of GeBiTe layer | Resistance ratio (Rratio) | Applicability to phase change memory cell |
|---|---|---|---|
| 1(A1) | $Ge_{21.43}Bi_{16.67}Te_{61.9}$ | $>10^4$ | ○ |
| 2(A2) | $Ge_{44.51}Bi_{0.35}Te_{55.14}$ | $>10^4$ | ○ |
| 3(A3) | $Ge_{59.33}Bi_{0.5}Te_{40.17}$ | $>10^4$ | ○ |
| 4(A4) | $Ge_{38.71}Bi_{16.13}Te_{45.16}$ | $>10^4$ | ○ |

In Table 2, the resistance ratio Rratio indicates a ratio of a resistance of the undoped GeBiTe layer having an amorphous state to a resistance of the undoped GeBiTe layer having a crystalline state. Also, the applicability to the phase change cell of Table 2 means the result whether actual phase change memory cells fabricated using the undoped GeBiTe layer as the phase change material layer show a reset current Ireset lower than 0.5 mA and a reset pulse width W (or a set pulse width) not greater than 10 ns as described with reference to FIGS. 10 and 11.

As can be seen from Table 2, all the undoped GeBiTe layers having composition ratios corresponding to the points A1, A2, A3 and A4 of FIG. 4A showed a resistance ratio higher than $10^4$ and showed the applicability to the phase change material layer of the phase change memory cell. In addition, phase change characteristics of the undoped GeBiTe layers having various composition ratios in an area surrounded by the four points A1, A2, A3 and A4 were evaluated.

The phase change material layers having composition ratios represented by coordinates on a straight line between the points B1 and B2 of FIG. 4A showed the phase change characteristics described in Table 3.

TABLE 3

| Sample No. (point) | Composition of GeBiTe layer | Resistance ratio (Rratio) | Applicability to phase change cell |
|---|---|---|---|
| 1(B2) | $Ge_{48.7}Bi_{1.0}Te_{50.3}$ | $>10^7$ | ○ |
| 2 | $Ge_{48.48}Bi_{1.22}Te_{50.3}$ | $>10^7$ | ○ |
| 3 | $Ge_{48.28}Bi_{1.38}Te_{50.34}$ | $>10^7$ | ○ |
| 4 | $Ge_{48.0}Bi_{1.6}Te_{50.4}$ | $>10^7$ | ○ |
| 5 | $Ge_{47.62}Bi_{1.9}Te_{50.48}$ | $>10^7$ | ○ |
| 6 | $Ge_{47.06}Bi_{2.35}Te_{50.59}$ | $>10^7$ | ○ |
| 7 | $Ge_{46.15}Bi_{3.08}Te_{50.77}$ | $>10^7$ | ○ |
| 8 | $Ge_{44.44}Bi_{4.45}Te_{51.11}$ | $>10^7$ | ○ |
| 9 | $Ge_{42.86}Bi_{5.71}Te_{51.43}$ | $>10^7$ | ○ |
| 10 | $Ge_{41.94}Bi_{6.45}Te_{51.61}$ | $>10^6$ | ○ |
| 11 | $Ge_{41.38}Bi_{6.9}Te_{51.72}$ | $>10^6$ | ○ |
| 12 | $Ge_{40.74}Bi_{7.41}Te_{51.85}$ | $>10^6$ | ○ |
| 13 | $Ge_{40.0}Bi_{8.0}Te_{52.0}$ | $>10^6$ | ○ |
| 14 | $Ge_{39.13}Bi_{8.7}Te_{52.17}$ | $>10^6$ | ○ |
| 15 | $Ge_{38.1}Bi_{9.52}Te_{52.38}$ | $>10^6$ | ○ |
| 16 | $Ge_{36.84}Bi_{10.53}Te_{52.63}$ | $>10^5$ | ○ |
| 17 | $Ge_{35.29}Bi_{11.77}Te_{52.94}$ | $>10^5$ | ○ |
| 18 | $Ge_{33.33}Bi_{13.34}Te_{53.33}$ | $>10^5$ | ○ |
| 19(B1) | $Ge_{30.77}Bi_{15.38}Te_{53.85}$ | $>10^5$ | ○ |
| 20 | $Ge_{27.27}Bi_{18.18}Te_{54.55}$ | 1 | x |

As can be seen from Table 3, all the undoped GeBiTe layers having composition ratios corresponding to coordinates on a straight line between the points B1 and B2 of FIG. 4A showed a resistance ratio higher than $10^5$, and showed the applicability to the phase change material layer of the phase change memory cell. In contrast, the undoped GeBiTe layer corresponding to sample No. 20 of Table 3 showed phase change characteristics not suitable for the phase change material layer of the phase change memory cell as a material layer having a composition ratio out of the range surrounded by the points A1, A2, A3 and A4 of FIG. 4A.

Also, the phase change material layers having composition ratios represented by coordinates on a straight line between the points B3 and B4 of FIG. 4A showed phase change characteristics described in Table 4.

TABLE 4

| Sample No (point) | Composition of GeBiTe layer | Resistance ratio (Rratio) | Applicability to phase change cell |
|---|---|---|---|
| 1(B4) | $Ge_{38.7}Bi_{16.1}Te_{45.2}$ | $>10^5$ | ○ |
| 2 | $Ge_{49.2}Bi_{8.2}Te_{42.6}$ | $>10^5$ | ○ |
| 3 | $Ge_{50.7}Bi_{7.0}Te_{42.3}$ | $>10^5$ | ○ |
| 4 | $Ge_{51.8}Bi_{6.2}Te_{42.0}$ | $>10^5$ | ○ |
| 5 | $Ge_{52.7}Bi_{5.5}Te_{41.8}$ | $>10^5$ | ○ |
| 6(B3) | $Ge_{59.3}Bi_{0.5}Te_{40.2}$ | $>10^5$ | ○ |

As can be seen from Table 4, all the undoped GeBiTe layers having composition ratios corresponding to coordinates on a straight line between the points B3 and B4 of FIG. 4A showed a resistance ratio Rratio higher than $10^5$, and could be applied to the phase change material layer of the phase change memory cell.

Furthermore, phase change material layers having composition ratios corresponding to coordinates on a straight line between the points C3 and C6 of FIG. 4A showed phase change characteristics described in Table 5.

TABLE 5

| Sample No. (point) | Composition of GeBiTe layer | Resistance ratio (Rratio) | Applicability to phase change cell |
|---|---|---|---|
| 1 | $Ge_{41.3}Bi_{11.3}Te_{47.4}$ | about $10^1$ | □ |
| 2(C6) | $Ge_{44.0}Bi_{9.0}Te_{47.0}$ | $>10^4$ | ○ |
| 3 | $Ge_{45.83}Bi_{7.5}Te_{46.67}$ | $>10^4$ | ○ |
| 4 | $Ge_{47.14}Bi_{6.43}Te_{46.43}$ | $>10^5$ | ○ |
| 5 | $Ge_{48.13}Bi_{5.63}Te_{46.24}$ | $>10^5$ | ○ |
| 6 | $Ge_{48.89}Bi_{5.0}Te_{46.11}$ | $>10^5$ | ○ |
| 7 | $Ge_{49.5}Bi_{4.5}Te_{46.0}$ | $>10^5$ | ○ |
| 8 | $Ge_{50.0}Bi_{4.09}Te_{45.91}$ | $>10^5$ | ○ |
| 9 | $Ge_{52.38}Bi_{2.14}Te_{45.48}$ | $>10^5$ | ○ |
| 10 | $Ge_{53.23}Bi_{1.45}Te_{45.32}$ | $>10^5$ | ○ |
| 11 | $Ge_{53.66}Bi_{1.1}Te_{45.24}$ | $>10^5$ | ○ |
| 12 | $Ge_{53.92}Bi_{0.88}Te_{45.2}$ | $>10^5$ | ○ |
| 13 | $Ge_{54.1}Bi_{0.74}Te_{45.16}$ | $>10^5$ | ○ |
| 14 | $Ge_{54.23}Bi_{0.63}Te_{45.14}$ | $>10^5$ | ○ |
| 15 | $Ge_{54.32}Bi_{0.56}Te_{45.12}$ | $>10^5$ | ○ |
| 16 | $Ge_{54.4}Bi_{0.49}Te_{45.11}$ | $>10^5$ | ○ |
| 17(C3) | $Ge_{54.43}Bi_{0.47}Te_{45.1}$ | $>10^5$ | ○ |

As can be seen from Table 5, all the undoped GeBiTe layers (samples 2 to 17) having composition ratios corresponding to coordinates on a straight line between the points C3 and C6 of FIG. 4A showed a resistance ratio higher than $10^4$, and was applicable to a phase change material layer of the phase change memory cell. In contrast, the undoped GeBiTe layer corresponding to sample No. 1 of Table 5 showed a resistance ratio of 10 (Rratio), which is relatively low to be used as the phase change material layer of the phase change memory cell. The undoped GeBiTe layer of the sample No. 1 in Table 5 is a material layer having a composition ratio out of the range surrounded by the points C1, C2, C3, C4, C5 and C6 of FIG. 4A.

According to the present invention as described above, a reset current and a programming speed of a phase change memory cell can be significantly decreased by employing an undoped GeBiTe layer, a doped GeBiTe layer or a doped GeTe layer as a phase change material layer of the phase change memory cell. Therefore, a high-performance phase change memory device can be realized. Also, the decrease of the reset current may lead to a decrease of a channel width of an access MOS transistor used as a switching device of the phase change memory cell. As a result, the integration density of the phase change memory device can be significantly improved.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A phase change memory cell, comprising:
   an interlayer insulating layer formed on a semiconductor substrate;
   a first electrode and a second electrode disposed on the interlayer insulating layer;
   a phase change material layer disposed between the first and second electrodes, the phase change material layer being one of an undoped GeBiTe layer having a composition ratio within a range surrounded by four points (A1($Ge_{21.43}$, $Bi_{16.67}$, $Te_{61.9}$), A2($Ge_{44.51}$, $Bi_{0.35}$, $Te_{55.14}$), A3($Ge_{59.33}$, $Bi_{0.5}$, $Te_{40.17}$) and A4($Ge_{38.71}$, $Bi_{16.13}$, $Te_{45.16}$)) represented by coordinates on a triangular composition diagram having vertices of germanium (Ge), bismuth (Bi) and tellurium (Te), a doped GeBiTe layer containing an impurity and having a composition ratio within a range surrounded by four points (D1($Ge_{10}$, $Bi_{20}$, $Te_{70}$), D2($Ge_{30}$, $Bi_0$, $Te_{70}$), D3($Ge_{70}$, $Bi_0$, $Te_{30}$) and D4($Ge_{50}$, $Bi_{20}$, $Te_{30}$)) represented by coordinates on the triangular composition diagram, and a doped GeTe layer containing an impurity and having a composition ratio corresponding to coordinates on a straight line between the points D2 and D3; and
   a bit line disposed on the interlayer insulating layer and electrically connected to the second electrode.

2. The phase change memory cell according to claim 1, further comprising:
   a cell switching device formed on the semiconductor substrate and electrically connected to the first electrode.

3. The phase change memory cell according to claim 2, wherein the cell switching device is a metal oxide semiconductor (MOS) transistor including a source region and a drain region formed in the semiconductor substrate as well as a word line disposed over a channel region between the source region and the drain region, and the first electrode is electrically connected to one of the source and drain regions.

4. The phase change memory cell according to claim 2, wherein the cell switching device is a cell diode.

5. The phase change memory cell according to claim 4, wherein the cell diode is a vertical cell diode having an second conductivity-type semiconductor and a first conductivity-type semiconductor which are sequentially stacked in the interlayer insulating layer, and the first conductivity-type semiconductor is electrically connected to the first electrode.

6. The phase change memory cell according to claim 5, further comprising:
   a word line electrically connected to the second conductivity-type semiconductor of the cell diode.

7. The phase change memory cell according to claim 1, wherein the first electrode is a titanium nitride layer (TiN) or a titanium aluminum nitride layer (TiAlN).

8. The phase change memory cell according to claim 1, wherein the second electrode is a titanium nitride layer (TiN).

9. The phase change memory cell according to claim 1, wherein the undoped GeBiTe layer or the doped GeBiTe layer has a composition ratio within a range surrounded by four points (B1($Ge_{30.77}$, $Bi_{15.38}$, $Te_{53.85}$), B2($Ge_{48.7}$, $Bi_{1.0}$, $Te_{50.3}$), B3($Ge_{59.3}$, $Bi_{0.5}$, $Te_{40.2}$) and B4($Ge_{38.7}$, $Bi_{16.1}$, $Te_{45.2}$)) represented by coordinates on a triangular composition diagram having vertices of Ge, Bi and Te.

10. The phase change memory cell according to claim 1, wherein the undoped GeBiTe layer or the doped GeBiTe layer has a composition ratio within a range surrounded by six points (C1($Ge_{33.33}$, $Bi_{13.34}$, $Te_{53.33}$), C2($Ge_{48.7}$, $Bi_{1.0}$, $Te_{50.3}$), C3($Ge_{54.43}$, $Bi_{0.47}$, $Te_{45.1}$), C4($Ge_{59.3}$, $Bi_{0.5}$, $Te_{40.2}$), C5($Ge_{47.1}$, $Bi_{9.8}$, $Te_{43.1}$) and C6($Ge_{44}$, $Bi_9$, $Te_{47}$)) represented by coordinates on a triangular composition diagram having vertices of Ge, Bi and Te.

11. The phase change memory cell according to claim 1, wherein the impurity comprises at least one element selected from the group consisting of nitrogen (N), carbon (C), selenium (Se), indium (In), oxygen (O), gallium (Ga), silicon (Si), stannum (Sn), plumbum (Pb), phosphorus (P), arsenic (As), antimony (Sb) and sulfur (S).

12. The phase change memory cell according to claim 11, wherein content of the impurity is within the range of 0.01 atomic % to 20 atomic %.

13. A phase change memory device, comprising:
   a semiconductor substrate having a cell array area and a peripheral circuit area;
   an interlayer insulating layer formed on the semiconductor substrate;
   a first electrode and a second electrode disposed on the interlayer insulating layer in the cell array area;
   a phase change material layer disposed between the first and second electrodes, the phase change material layer being one of an undoped GeBiTe layer having a composition ratio within a range surrounded by four points (A1($Ge_{21.43}$, $Bi_{16.67}$, $Te_{61.9}$), A2($Ge_{44.51}$, $Bi_{0.35}$, $Te_{55.14}$), A3($Ge_{59.33}$, $Bi_{0.5}$, $Te_{40.17}$) and A4($Ge_{38.71}$, $Bi_{16.13}$, $Te_{45.16}$)) represented by coordinates on a triangular composition diagram having vertices of germanium (Ge), bismuth (Bi) and tellurium (Te), a doped GeBiTe layer containing an impurity and having a composition ratio within a range surrounded by four points (D1($Ge_{10}$, $Bi_{20}$, $Te_{70}$), D2($Ge_{30}$, $Bi_0$, $Te_{70}$), D3($Ge_{70}$, $Bi_0$, $Te_{30}$) and D4($Ge_{50}$, $Bi_{20}$, $Te_{30}$)) represented by coordinates on the triangular composition diagram, and a doped GeTe layer containing an impurity and having a composition ratio corresponding to coordinates on a straight line between the points D2 and D3; and
   a bit line disposed on the interlayer insulating layer and electrically connected to the second electrode.

14. The phase change memory device according to claim 13, further comprising:
   a cell switching device formed on the semiconductor substrate in the cell array area and electrically connected to the first electrode.

15. The phase change memory device according to claim 14, wherein the cell switching device is a metal oxide semiconductor (MOS) transistor having a source region and a drain region formed in the semiconductor substrate as well as a word line disposed over a channel region between the source region and the drain region, and the first electrode is electrically connected to one of the source and drain regions.

16. The phase change memory device according to claim 14, wherein the cell switching device is a cell diode.

17. The phase change memory device according to claim 16, wherein the cell diode is a vertical cell diode having an second conductivity-type semiconductor and a first conductivity-type semiconductor which are sequentially stacked on the interlayer insulating layer, and the first conductivity-type semiconductor is electrically connected to the first electrode.

18. The phase change memory device according to claim 17, further comprising:
a word line electrically connected to the second conductivity-type semiconductor of the cell diode.

19. The phase change memory device according to claim 13, wherein the first electrode is a titanium nitride layer (TiN) or a titanium aluminum nitride layer (TiAlN).

20. The phase change memory device according to claim 13, wherein the second electrode is a titanium nitride layer (TiN).

21. The phase change memory device according to claim 13, wherein the undoped GeBiTe layer or the doped GeBiTe layer has a composition ratio within a range surrounded by four points (B1($Ge_{30.77}$, $Bi_{15.38}$, $Te_{53.85}$), B2($Ge_{48.7}$, $Bi_{1.0}$, $Te_{50.3}$), B3($Ge_{59.3}$, $Bi_{0.5}$, $Te_{40.2}$) and B4($Ge_{38.7}$, $Bi_{16.1}$, $Te_{45.2}$)) represented by coordinates on a triangular composition diagram having vertices of Ge, Bi and Te.

22. The phase change memory device according to claim 13, wherein the undoped GeBiTe layer or the doped GeBiTe layer has a composition ratio within a range surrounded by six points (C1($Ge_{33.33}$, $Bi_{13.34}$, $Te_{53.33}$), C2($Ge_{48.7}$, $Bi_{1.0}$, $Te_{50.1}$), C3($Ge_{54.43}$, $Bi_{0.47}$, $Te_{45.1}$), C4($Ge_{59.3}$, $Bi_{0.5}$, $Te_{40.2}$), C5($Ge_{47.1}$, $Bi_{9.8}$, $Te_{43.1}$) and C6($Ge_{44}$, $Bi_9$, $Te_{47}$)) represented by coordinates on a triangular composition diagram having vertices of Ge, Bi and Te.

23. The phase change memory device according to claim 13, wherein the impurity comprises at least one element selected from the group consisting of nitrogen (N), carbon (C), selenium (Se), indium (In), oxygen (O), gallium (Ga), silicon (Si), stannum (Sn), plumbum (Pb), phosphorus (P), arsenic (As), antimony (Sb) and sulfur (S).

24. The phase change memory device according to claim 23, wherein content of the impurity is within the range of 0.01 atomic % to 20 atomic %.

* * * * *